(12) United States Patent
Whited et al.

(10) Patent No.: US 11,651,593 B2
(45) Date of Patent: May 16, 2023

(54) CLOUD-BASED ROAD SEGMENT VEHICLE AND PEDESTRIAN TREND ANALYSIS

(71) Applicant: Verizon Patent and Licensing Inc., Arlington, VA (US)

(72) Inventors: Matthew B. Whited, Encinitas, CA (US); Sheng S. Du, San Diego, CA (US); Abby Charfauros, San Diego, CA (US); Bing Yao, San Diego, CA (US); Fang-Pin Chang, San Marcos, CA (US)

(73) Assignee: Verizon Patent and Licensing Inc., Basking Ridge, NJ (US)

( * ) Notice: Subject to any disclaimer, the term of this patent is extended or adjusted under 35 U.S.C. 154(b) by 734 days.

(21) Appl. No.: 16/119,570

(22) Filed: Aug. 31, 2018

(65) Prior Publication Data

US 2020/0076878 A1 Mar. 5, 2020

(51) Int. Cl.
*G06V 20/54* (2022.01)
*G08G 1/01* (2006.01)
(Continued)

(52) U.S. Cl.
CPC .............. *G06V 20/54* (2022.01); *G06F 16/29* (2019.01); *G06F 30/20* (2020.01); *G08G 1/0125* (2013.01);
(Continued)

(58) Field of Classification Search
CPC ........... G06K 9/00785; G06K 2209/27; G06K 9/00979; G06F 30/20; G06F 16/29;
(Continued)

(56) References Cited

U.S. PATENT DOCUMENTS 7,155,376 B2 * 12/2006 Yang .................... G08G 1/0129
703/8
8,532,965 B2 * 9/2013 Hirata .................. G08G 1/0104
703/8

(Continued)

OTHER PUBLICATIONS

Datondji, S., et al. "A Survey of Vision-Based Traffic Monitoring of Road Intersections" IEEE Transactions on Intelligent Transportation Systems, vol. 17, issue 10, pp. 2681-2698 (2016) available from <https://ieeexplore.ieee.org/document/7458203> (Year: 2016).*

(Continued)

*Primary Examiner* — Jay Hann

(57) ABSTRACT

A network device receives, from multiple smart cameras located at different road segments of multiple real-world road segments, first data describing a location and configuration of each of the multiple real-world road segments, and second data describing movement of one or more objects at each of the multiple real-world road segments. The network device generates multiple virtual road segments based on the first data, wherein each of the multiple virtual road segments describes one of the multiple real-world road segments; and uses a physics engine to simulate, based on the generated multiple virtual road segments and the second data, movement of vehicles or pedestrians through the multiple real-world road segments to analyze traffic characteristics, trends or events. The network device generates road segment alterations for reconfiguring one or more of the multiple real-world road segments based on the analysis of the traffic characteristics, trends, or events.

20 Claims, 17 Drawing Sheets

(51) Int. Cl.
  *G06F 30/20* (2020.01)
  *G08G 1/04* (2006.01)
  *G06F 16/29* (2019.01)

(52) U.S. Cl.
  CPC ............ *G08G 1/04* (2013.01); *G06V 2201/10* (2022.01); *G08G 1/0116* (2013.01)

(58) Field of Classification Search
  CPC ......... G06F 30/15; H04L 67/10; H04L 67/12; H04L 67/22; G08G 1/0125; G08G 1/04; G08G 1/0116; G08G 1/0129; G08G 1/0145; G08G 1/005
  See application file for complete search history.

(56) References Cited

U.S. PATENT DOCUMENTS

| | | | | |
|---|---|---|---|---|
| 8,894,413 | B2* | 11/2014 | Pang | G09B 9/02 434/62 |
| 10,223,911 | B2* | 3/2019 | Modi | G08G 1/0145 |
| 11,138,349 | B2* | 10/2021 | Mizuta | G06F 30/20 |
| 2010/0070253 | A1* | 3/2010 | Hirata | G08G 1/0104 703/8 |
| 2017/0161410 | A1* | 6/2017 | Mizuta | G06F 30/20 |
| 2018/0096595 | A1* | 4/2018 | Janzen | G06K 9/00785 |

OTHER PUBLICATIONS

George, A., et al. "IOT Based Smart Traffic Light Control System" Int'l Conf. on Control Power Communication & Computing Tech., (Mar. 2018) available from <https://ieeexplore.ieee.org/document/8574285> (Year: 2018).*

Nandury, S. & Begum, B. "Strategies to Handle Big Data for Traffic Management in Smart Cities" Int'l Conf. on Advances in Computing Communications & Informatics, pp. 356-364 (2016) available from <https://ieeexplore.ieee.org/document/7732072> (Year: 2016).*

Nagy, A. & Simon V. "Survey on Traffic Prediction in Smart Cities" Pervasive & Mobile Computing, vol. 50, pp. 148-163 (Jul. 2018) (Year: 2018).*

Sreekumar, U., et al. "Real-time Traffic Pattern Collection and Analysis Model for Intelligent Traffic Intersection" IEEE Int'l Conf. on Edge Computing, pp. 140-143 (Jul. 2018) (Year: 2018).*

\* cited by examiner

CLOUD-BASED ROAD SEGMENT VEHICLE AND PEDESTRIAN TREND ANALYSIS

BACKGROUND

Public roadways and the associated infrastructure, such as street lights and traffic signaling lights, involve costly expenditures which are ultimately passed on to taxpayers. Once a particular segment of a roadway has been designed, and then constructed, the efficiency and safety of that road segment can dramatically change over time due to changing traffic patterns caused by, for example, population growth or new roads near the road segment. Over time, a configuration of a particular road segment that was considered efficient and safe when it was built often becomes inefficient and less safe due to changes in traffic patterns. For example, over time, a configuration of a particular road segment may become less safe, such as for pedestrians, bicycles, or motorcycles, due to changes in traffic patterns. Remedying deficiencies in such a road segment can be very costly and impose significant inconveniences to drivers.

DETAILED DESCRIPTION OF THE PREFERRED EMBODIMENTS

Figure 1:
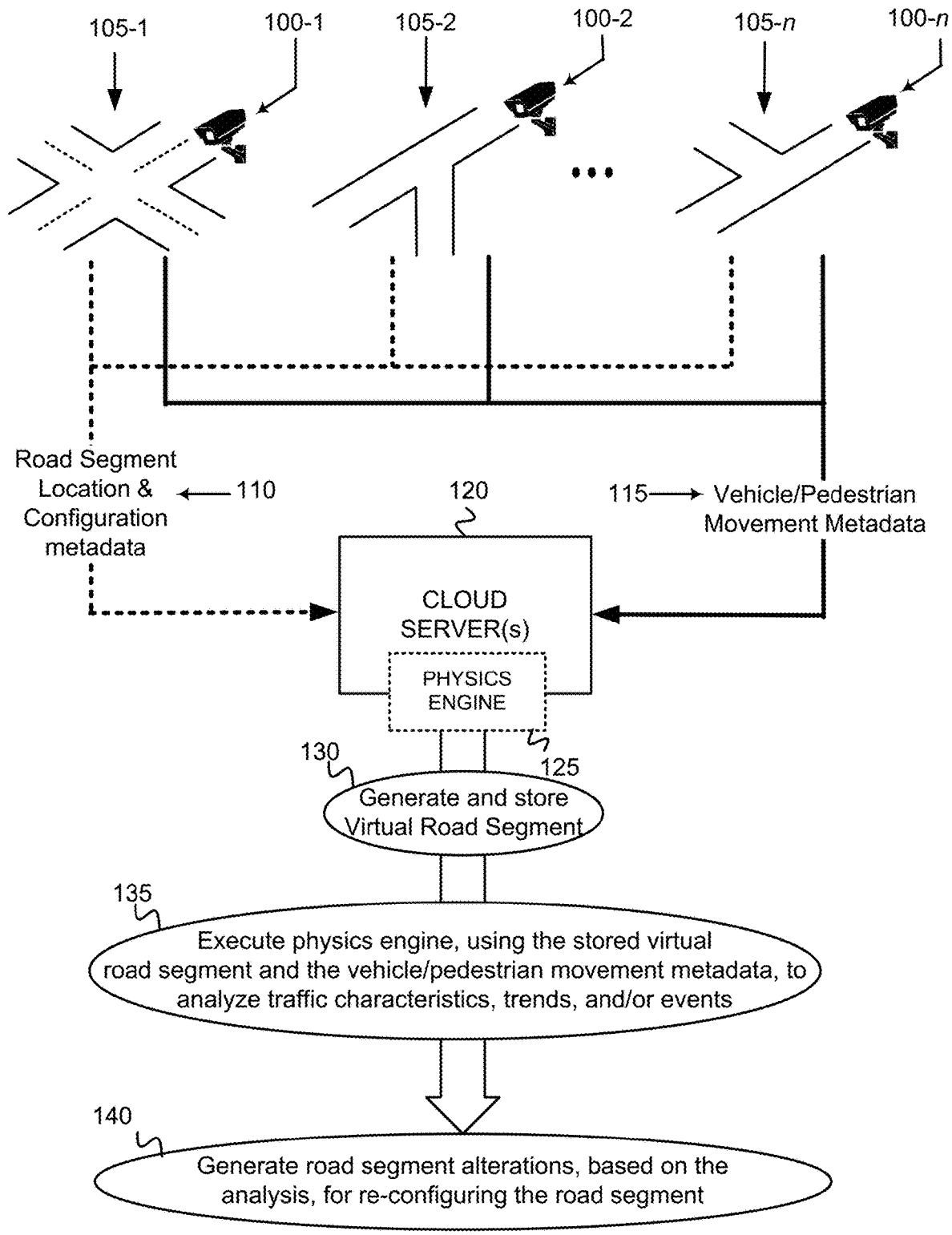
FIG. 1 depicts an overview of cloud-based road segment traffic and trend analysis using road configuration metadata and vehicle/pedestrian movement metadata received from smart cameras disposed at multiple road segments.

The following detailed description refers to the accompanying drawings. The same reference numbers in different drawings may identify the same or similar elements. The following detailed description does not limit the invention.

Smart cameras, or intelligent cameras, include machine vision systems that further include image capturing components that capture digital images of the environment in proximity to the smart cameras, and image processing components for performing image processing to generate metadata based on the processing of the captured digital images. The image processing performed by the smart cameras, and the metadata generated based on the image processing, depends on the particular context in which the smart cameras are deployed. For example, a smart camera deployed at a road segment of a roadway system may process captured images to generate metadata that describes the movement of objects, such as vehicles and/or pedestrians, passing through the road segment. As another example, a smart camera may be configured with tripwires and/or zones that apply to the road segment viewed by the smart camera, and the image processing performed at the smart camera may determine the movement of vehicles and/or pedestrians relative to the configured tripwires or zones. Changes in configuration of tripwires and zones may have to be performed manually at each smart camera, or pushed out to each smart camera via a network connection. Smart cameras typically have limited processing resources (e.g., limited processing speed and memory storage capacity). Due to the limited processing resources, smart cameras have constraints on the amount of image processing and the type of image processing they can perform. For example, the smart camera may be only capable of storing, and performing image processing, for a limited number of tripwires or zones for a particular real-world road segment.

In embodiments described herein, a cloud server acts as a centralized station for receiving road segment location and configuration metadata, and vehicle/pedestrian movement metatadata, generated by multiple smart cameras based on processing road segment images. The multiple smart cameras are disposed at multiple, different, real-world road segments for capturing and processing images of those real-world road segments. The cloud server generates one or more virtual road segments for each of the multiple real-world road segments based on the received road segment location and configuration metadata, stores the generated virtual road segments in a first database, and stores the vehicle/pedestrian movement metadata in a second database. The cloud server subsequently retrieves one or more of the virtual road segments and the vehicle/pedestrian movement metadata from the database, and executes a physics engine to simulate moving objects in the one or more of the virtual road segments to analyze traffic characteristics, trends, and/or events associated with the virtual road segments. The cloud server, using an expert system, generates road segment alterations for reconfiguring identified real-world road segments based on the analysis of the traffic characteristics, trends, and/or events. The analysis of the traffic characteristics, trends, and/or events may, for example, identify deficiencies in road segment design, road segment traffic lighting, or road segment traffic signage that significantly impacts vehicle or pedestrian safety.

FIG. 1 depicts an overview of cloud-based road segment traffic and trend analysis using road configuration metadata and vehicle/pedestrian movement metadata received from smart cameras disposed at multiple different real-world road segments. Smart cameras 100-1 through 100-n may be disposed at multiple different real-world road segments 105-1 through 105-n. The smart camera 100 at each real-world road segment 105 captures images of the real-world road segment and objects, such as vehicles or pedestrians, moving through the road segment, and then uses image processing functionality to analyze the images to generate first metadata 110 that describes a location and configuration of the real-world road segment, and second metadata 115 that describes the movement of the objects within the particular road segment. The smart cameras 100-1 through 100-n send the generated first metadata 110 and the generated second metadata 115 to a cloud server(s) 120 via a network (not shown in FIG. 1).

The road segment location and configuration metadata 110 may include geo-location metadata associated with aspects of the road segment, such as, for example, geo-location metadata that describes the physical dimensions and physical configuration of the road segment itself (e.g., locations and dimensions of thru-lanes, turn lanes, intersections, median strip, etc.). The road segment configuration metadata 110 may also include metadata that describes the types and locations of traffic signage on the road segment; the types, locations, and timing of traffic signals on the road segment; and the types, locations, and a level of lighting provided by roadway lights on the road segment.

The vehicle/pedestrian movement metadata 115 may include metadata that identifies the type of object(s), such as a pedestrian or a type of vehicle (e.g., car, truck, taxi, etc.), that is moving through the road segment 105. Metadata 115 may also describe a path taken by the object(s) through the road segment 105, including the speed and direction of the object(s) (e.g., the vehicle or pedestrian), as the object(s) transits the road segment 105 viewed by the smart camera 100.

As shown in FIG. 1, cloud server(s) 120 may generate 130, using the received road segment location and configuration metadata 110, one or more virtual road segments for each of the multiple different real-world road segments 105-1 through 105-n, and store data associated with the virtual road segments in a database (not shown). Cloud server(s) 120 may generate multiple virtual road segments for a given real-world segment 105 to facilitate the detection of different traffic patterns or events, and to allow for the parallel processing of movement metadata in each of the multiple virtual road segments. Cloud server(s) 120 may, for example, translate the road segment geo-location metadata into a coordinate system that is to be used in the virtual road segment such that the physical dimensions and configuration of the road segment are defined within the coordinate system. Cloud server(s) 120 may additionally translate the locations of the traffic signage, traffic signals, and roadway lights into the coordinate system. Cloud server(s) 120 may generate further virtual road segment data that describes the level of lighting provided by the roadway lights and the timing of the traffic signals located within the road segment 105 (e.g., timing of stop lights).

Cloud server(s) 120 may then execute 135 a physics engine 125, using the stored virtual road segment(s) and the received vehicle/pedestrian movement metadata 115, to analyze traffic characteristics, trends, and/or events associated with each of the virtual road segments. Physics engine 125 may execute algorithms that simulate classical mechanics (i.e., kinematics) as applied to the vehicle/pedestrian movement metadata 115 for an analysis of the traffic characteristics, trends, and/or events within the virtual road segment.

Cloud server(s) 120 may generate 140 road segment alterations, based on the analysis of the traffic characteristics, trends, and/or events associated with each of the virtual road segments, for reconfiguring the real-world road segment that corresponds to the analyzed virtual road segment. The analysis of the traffic characteristics, trends, and/or events associated with each virtual road segment may identify deficiencies in the configuration of the road segment that negatively impact vehicle or pedestrian traffic flow, or traffic safety, within the road segment. Cloud server(s) 120 may further, based on the analysis, generate alterations for reconfiguring the real-world road segment that address the identified deficiencies in the original configuration of the road segment. For example, the analysis of the traffic characteristics, trends, and/or events associated with a particular virtual road segment may identify deficiencies in the timing intervals associated with a signaling light (e.g., a stop light) that negatively affect traffic flow. In such a case, the cloud server(s) 120 may determine new timing intervals for the signaling light for reconfiguring the corresponding real-world road segment and improving the traffic flow. As another example, the analysis of the traffic characteristics, trends, and/or events associated with a particular virtual road segment may determine that the road segment should be reconfigured with a central turn lane to reduce traffic accidents and to improve the traffic flow.

Figure 2:
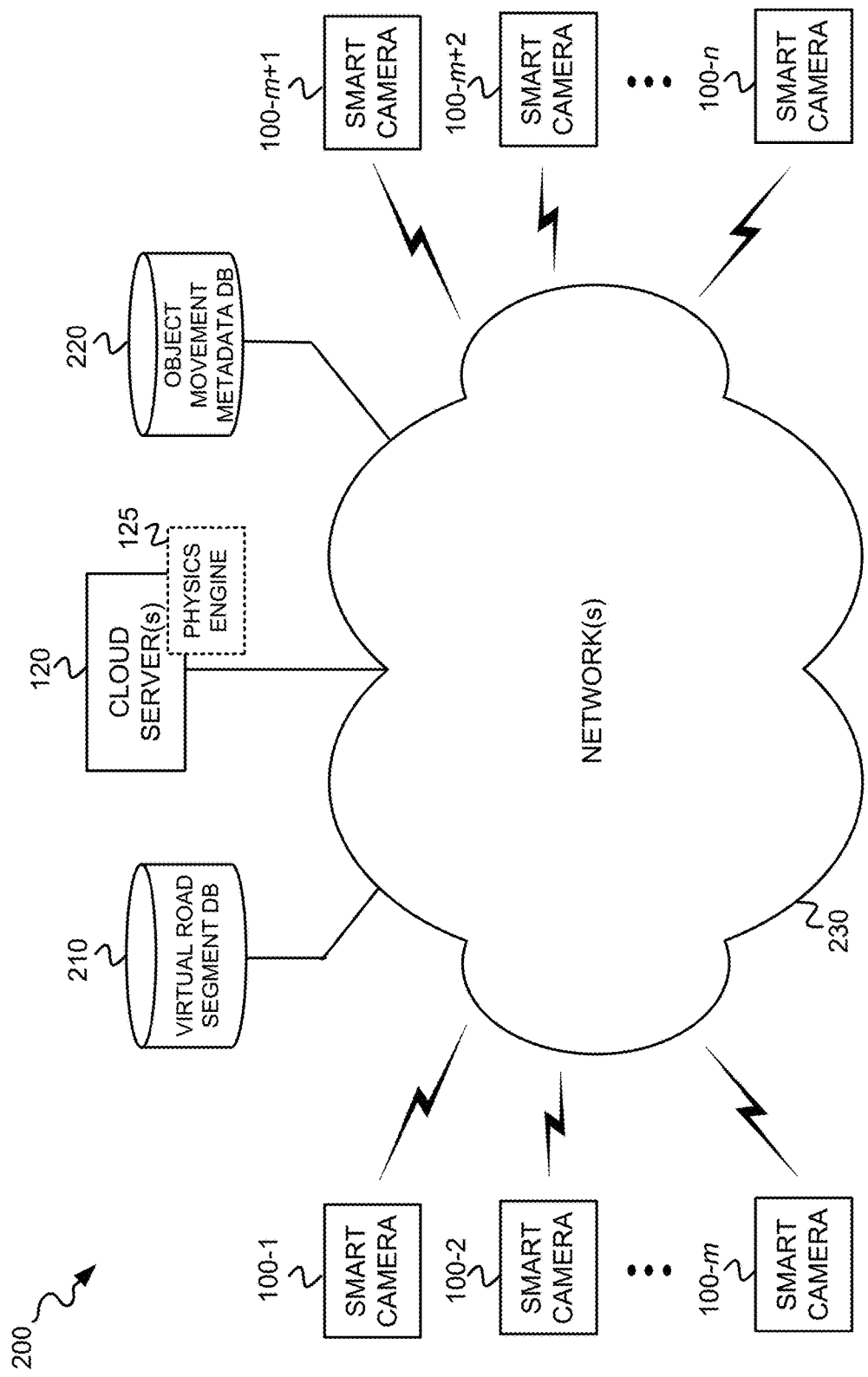
FIG. 2 depicts an exemplary network environment in which the cloud-based road segment traffic and trend analysis of metadata generated by smart cameras disposed at multiple different real-world road segments may be implemented.

FIG. 2 depicts an exemplary network environment 200 in which the cloud-based road segment traffic and trend analysis of metadata, generated by smart cameras 100 disposed at multiple different real-world road segments 105, may be implemented. Network environment 200 includes multiple smart cameras 100-1 through 100-n (where n is greater than or equal to one), a cloud server(s) 120, a virtual road segment database (DB) 210, an object movement metadata DB 220, and a network(s) 230.

Smart cameras 100-1 through 100-n (generically referred to herein as "smart camera 100" or "smart cameras 100") may each include a machine vision system that further includes image capturing circuitry/components for capturing images of at least a portion of a real-world road segment 105 at which the smart camera 100 is disposed. The machine vision system also includes image analysis circuitry/components that processes the captured images to generate metadata that describes the real-world road segment 105 and describes movement of objects, such as vehicles and pedestrians, through the real-world road segment 105. In some implementations, smart cameras 100 may each include a machine-to-machine (M2M) or Internet of Things (IoT) device that communicates over network(s) 230 with cloud server(s) 120.

Cloud server(s) 120 may include one or more network devices that receive the road segment location and configuration metadata 110 from smart cameras 100, generate virtual road segments based on the metadata 110, and store the metadata 110 and generated virtual road segments in virtual road segment DB 210. Cloud server(s) 120 additionally receives the vehicle/pedestrian movement metadata 115 from smart cameras 100 and stores the metadata 115 in object movement metadata DB 220. Cloud server(s) 120 also executes physics engine 125 to analyze traffic characteristics, trends, and/or events associated with virtual road segments retrieved from virtual road segment DB 210 based on vehicle/pedestrian movement metadata retrieved from object movement metadata DB 220. Cloud server(s) 120 additionally executes an expert system (not shown), having an expert knowledgebase, that may, based on analysis of the traffic characteristics, trends, and/or events of physics engine 125, identify deficiencies in the configuration of the road segment under analysis. Deficiencies in the road segment configuration may include, for example, the number of lanes, the number of turn lanes, the timing interval(s) of traffic signaling within the road segment, or the existence of, or lack of, particular traffic signs within the road segment. The expert system and expert knowledgebase may be used to identify any type of deficiency within a particular road segment based on the analysis of the virtual road segment simulation.

Virtual road segment DB 210 includes one or more network devices that each further include a memory device(s) that stores the road segment location and configuration metadata 110 received by cloud server(s) 120 from smart cameras 100. Virtual road segment DB 210 additionally stores virtual road segment data generated by cloud server(s) 120 based on the road segment location and configuration metadata 110. The memory device(s) of DB 210 may store a data structure, such as the exemplary data structure described below with respect to FIG. 5.

Object movement metadata DB 220 includes one or more network devices that each further include a memory device(s) that stores object movement metadata associated with real-world objects (e.g., vehicles and/or pedestrians) transiting through particular real-world road segments 105. The memory device(s) of DB 220 may store a data structure, such as the exemplary data structure described below with respect to FIG. 6.

Network(s) 230 may include one or more wired or wireless networks of various types including, for example, a telecommunications network (e.g., Public Switched Telephone Networks (PSTNs)), one or more wireless networks (e.g., a Public Land Mobile Network(s) (PLMN(s)), a satellite network(s)), the Internet, one or more wired and/or wireless local area networks (LANs), one or more wired and/or wireless wide area networks (WANs), one or more wired or wireless metropolitan area networks (MANs), an intranet(s), or a cable network(s) (e.g., an optical cable network).

The configuration of network components of network environment 200 shown in FIG. 2 is for illustrative purposes. Other configurations may be implemented. Therefore, network environment 200 may include additional, fewer and/or different components that may be configured in a different arrangement than that depicted in FIG. 2.

Figure 3:
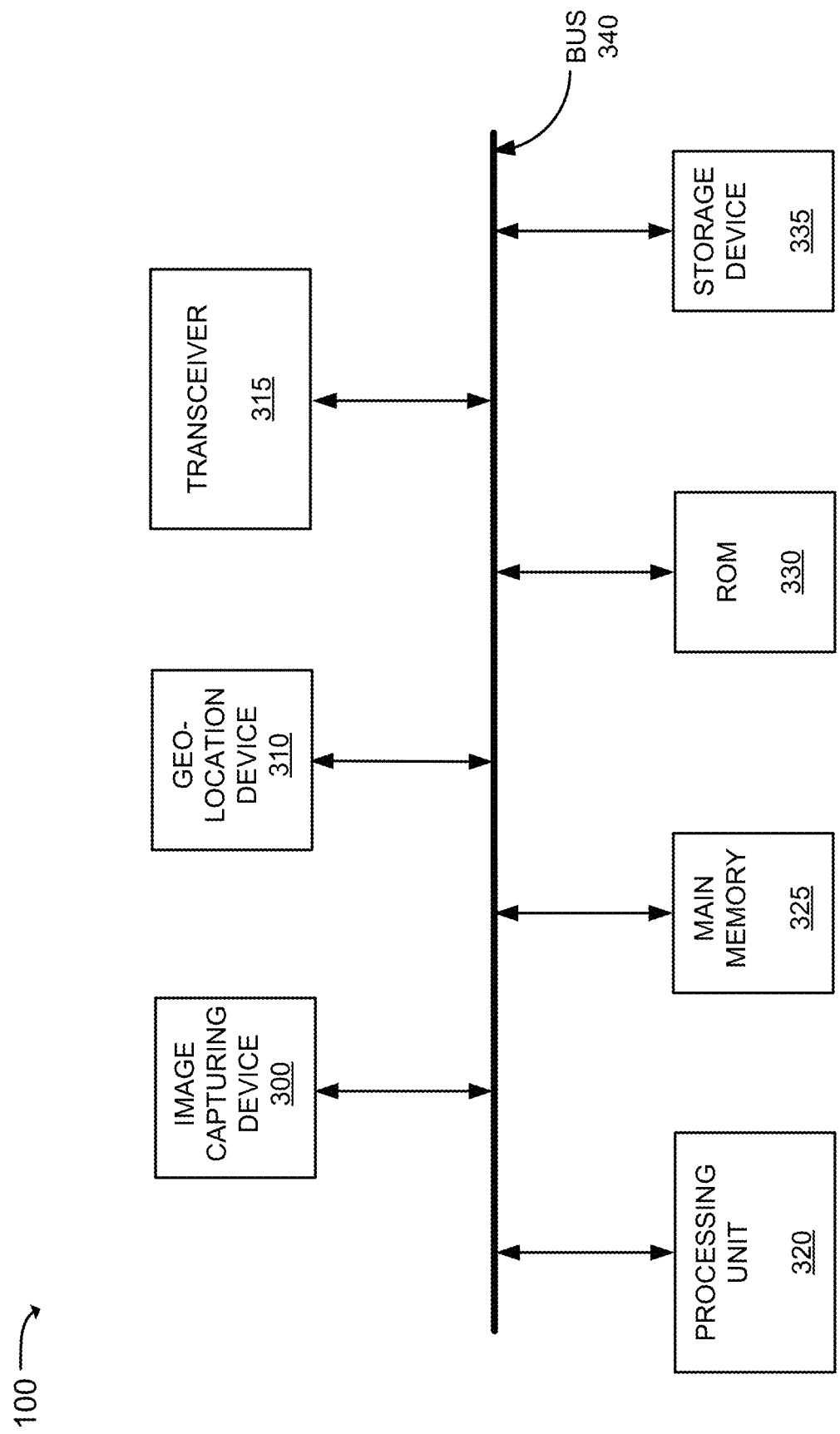
FIG. 3 is a diagram that depicts exemplary components of a smart camera of FIGS. 1 and 2.

FIG. 3 is a diagram that depicts exemplary components of a smart camera 100. Smart camera 100 may include an image capturing device 300, a geo-location device 310, a transceiver 315, a processing unit 320, a main memory 325, a Read Only Memory (ROM) 330, a storage device 335, and a bus 340.

Image capturing device 300 includes any type of image capturing device/component that captures digital images, such as digital images of at least a portion of a real-world road segment 105, and at least temporarily stores the digital images in main memory 325 or storage device 335. Geo-location device 310 includes any type of device that determines the geolocation of camera 100. In one implementation, geo-location device 310 may include a Global Position System (GPS) device that obtains accurate geo-location coordinate data from the GPS system.

Transceiver(s) 315 may include one or more transceivers that enable camera 100 to communicate with other devices and/or systems. For example, transceiver(s) 315 may include a wireless transceiver(s), and associated antenna(s), for communicating via a wireless network such as, for example, a PLMN of network(s) 230. Transceiver(s) 315 may alternatively, or additionally, include a wired transceiver(s) for communicating via a wired network, such as, for example, the Internet of network(s) 230.

Processing unit 320 may include one or more processors or microprocessors which interpret and execute stored instructions associated with one or more processes, or processing logic that implements the one or more processes. Processing unit 320 may include software, hardware, or a combination of software and hardware for executing the smart camera image analysis and image metadata generation described herein (e.g., as described in FIGS. 7 and 11). In some implementations, processing unit 320 may include programmable logic such as Field Programmable Gate Arrays (FPGAs) or accelerators.

Main memory 325 may include a random access memory (RAM), or another type of dynamic storage device, that may store information and instructions for execution by processing unit 320. ROM 330 may include a ROM device or another type of static storage device that may store static information and instructions for use by processing unit 320. Storage device 335 may include a magnetic and/or optical recording medium. Main memory 325, ROM 330 and storage device 335 may each be referred to herein as a "tangible non-transitory computer-readable medium" or "non-transitory storage medium." The smart camera operations set forth herein (e.g., in FIGS. 7 and 11) can be implemented as instructions that are stored in main memory 330, ROM 340 and/or storage device 350 for execution by processing unit 320. Bus 340 may include a path (e.g., electrical or optical) that permits communication among the components of camera 300.

The configuration of components of smart camera 100 illustrated in FIG. 3 is for illustrative purposes. Other configurations may be implemented. Therefore, smart camera 100 may include additional, fewer and/or different components than those depicted in FIG. 3.

Figure 4:
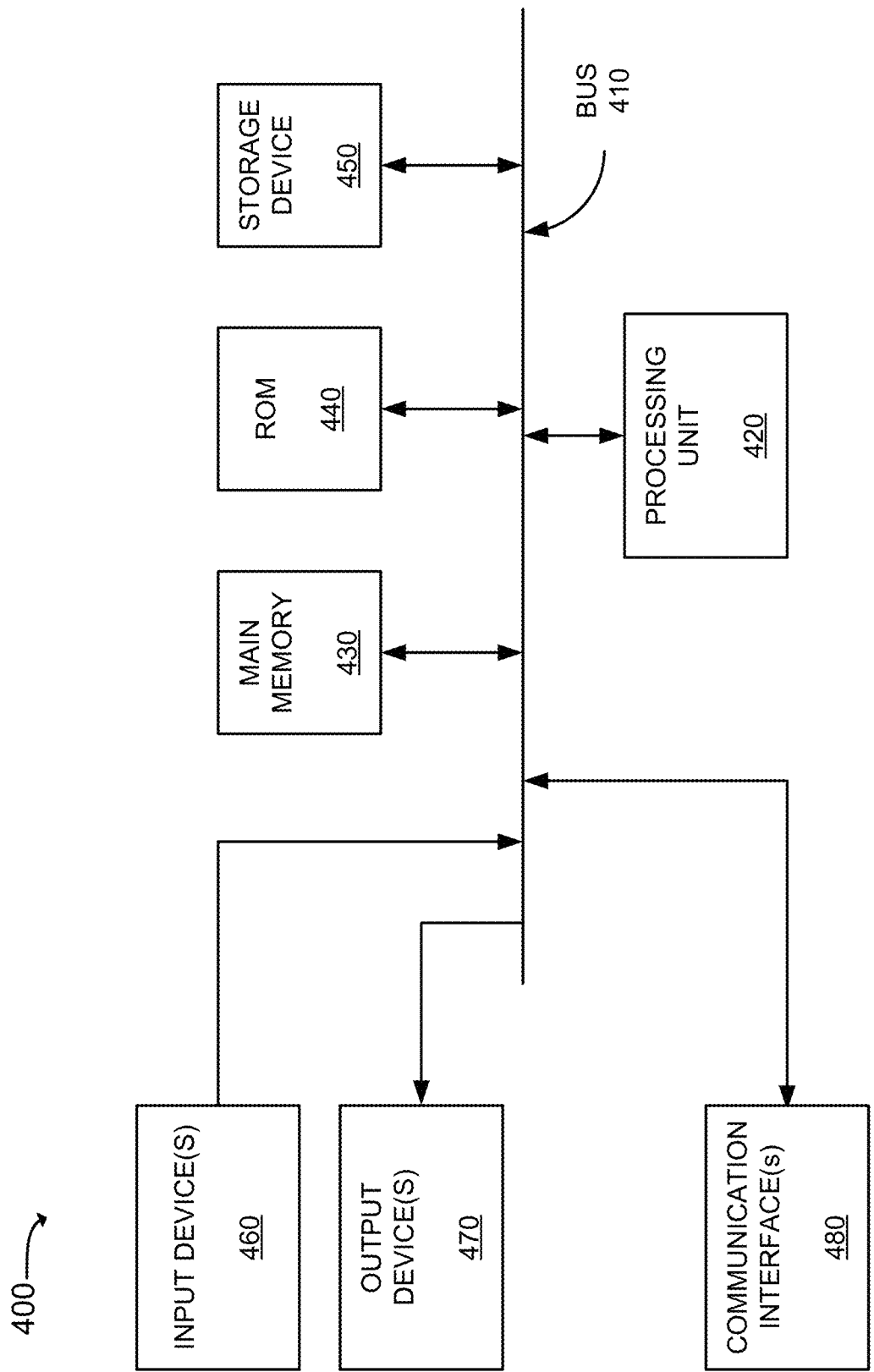
FIG. 4 is a diagram that depicts exemplary components of a device that may correspond to the cloud server, virtual road segment database, and object movement metadata database of FIG. 2.

FIG. 4 is a diagram that depicts exemplary components of a device 400. Each of the network devices of cloud server(s) 120, virtual road segment DB 210, and object movement metadata DB 220 may be configured the same as, or similar to, device 400, but possibly with some variations in components or configuration. Device 400 may include a bus 410, a processing unit 420, a main memory 430, a ROM 440, a storage device 450, an input device(s) 460, an output device(s) 470, and a communication interface(s) 480. Bus 410 may include a path (e.g., electrical or optical) that permits communication among the components of device 400.

Processing unit 420 may include one or more processors or microprocessors which may interpret and execute stored instructions associated with one or more processes, or processing logic that implements the one or more processes. For example, processing unit 420 may include, but is not limited to, programmable logic such as Field Programmable Gate Arrays (FPGAs) or accelerators. Processing unit 420 may include software, hardware, or a combination of software and hardware for executing the processes described herein. Main memory 430 may include a random access memory (RAM) or another type of dynamic storage device that may store information and instructions for execution by processing unit 420. ROM 440 may include a ROM device or another type of static storage device that may store static information and instructions for use by processing unit 420. Storage device 450 may include a magnetic and/or optical recording medium. Main memory 430, ROM 440 and storage device 450 may each be referred to herein as a "tangible non-transitory computer-readable medium" or "non-transitory storage medium." The operations set forth herein (e.g., in FIGS. 7, 11, and 14) can be implemented as instructions that are stored in main memory 430, ROM 440 and/or storage device 450 for execution by processing unit 420.

Input device 460 may include one or more mechanisms that permit an operator to input information into device 400, such as, for example, a keypad or a keyboard, a display with a touch sensitive panel, voice recognition and/or biometric mechanisms, etc. Output device 470 may include one or more mechanisms that output information to the operator, including a display, a speaker, etc. Input device 460 and output device 470 may, in some implementations, be implemented as a user interface (UI) that displays UI information and which receives user input via the UI. Communication interface(s) 480 may include at least one type of transceiver that enables device 400 to communicate with other devices and/or systems. For example, communication interface(s) 480 may include a wireless transceiver(s), and associated antenna(s), for communicating via network(s) 230. As another example, communication interface(s) 480 may include a wired transceiver(s) for communicating via network(s) 230.

The configuration of components of device 400 illustrated in FIG. 4 is for illustrative purposes. Other configurations may be implemented. Therefore, device 400 may include additional, fewer and/or different components than those depicted in FIG. 4.

Figure 5:
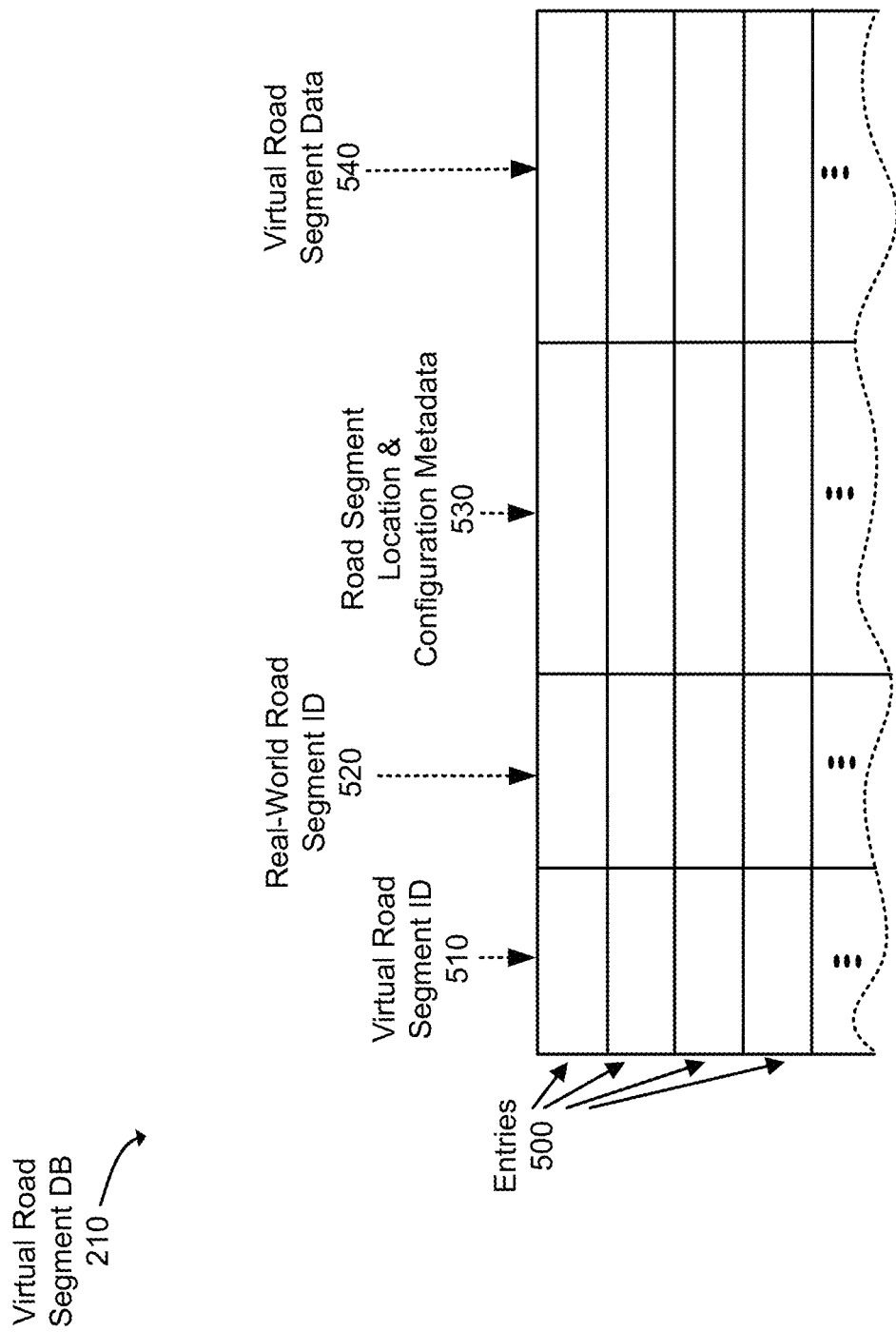
FIG. 5 is a diagram that depicts an exemplary implementation of a data structure that may be stored in the virtual road segment database of FIG. 2.

FIG. 5 is a diagram that depicts an exemplary implementation of a data structure that may be stored in virtual road segment DB 210. As shown, the data structure of DB 210 may include multiple entries 500. Each entry 500 may include a virtual road segment identifier (ID) field 510, a real-world segment ID field 520, a road segment location and configuration metadata field 530, and a virtual road segment data field 540.

Virtual road segment ID field 510 stores a unique ID assigned to a virtual road segment generated by cloud server(s) 120. Real-world segment ID field 520 stores a unique ID assigned to a real-world segment 105 that corresponds to the virtual road segment stored in field 510. Road segment location and configuration metadata field 530 stores metadata, generated by smart camera 100, that describes the location and configuration of at least a portion of the real-world road segment identified in field 520. Virtual road segment data field 540 stores data, generated by cloud server(s) 120 based on the road segment location and configuration metadata stored in field 530, that defines a corresponding virtual road segment that may be used for simulations by physics engine 125 of cloud server(s) 120.

To locate a particular entry 500, the data structure of DB 210 may be queried with, for example, a virtual road segment ID to locate an entry 500 having a matching virtual road segment ID stored in field 510. When such an entry 500 is located, data may be stored in one or more of fields 520, 530, and/or 540 of the entry 500, or data may be retrieved from one or more of fields 520, 530, or 540 of the entry 500. Other fields of an entry 500, instead of virtual road segment ID field 510, may be used for querying the data structure of DB 210, such as, for example, real-world road segment ID field 520.

Figure 6:
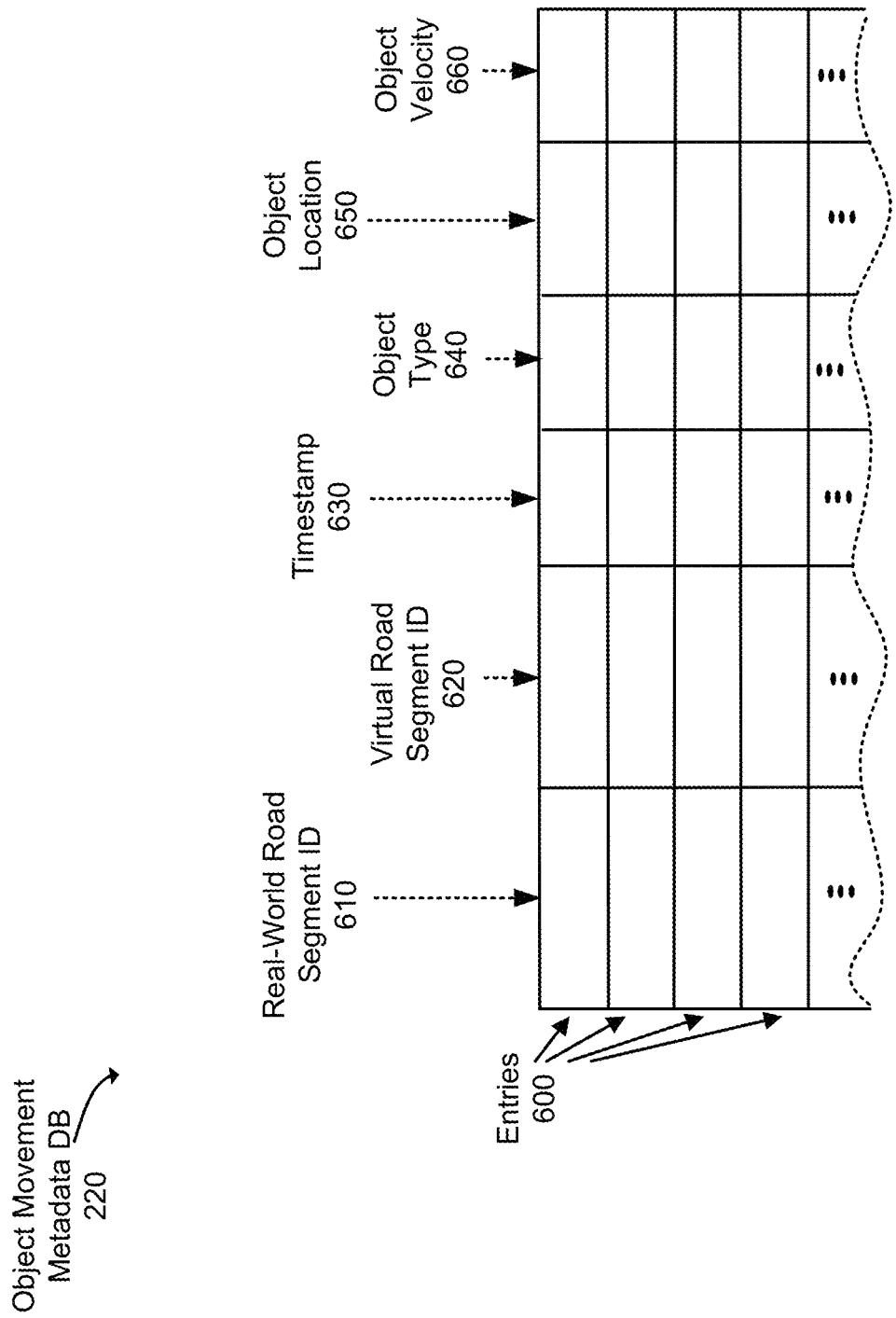
FIG. 6 is a diagram that depicts an exemplary implementation of a data structure that may be stored in the object movement metadata database of FIG. 2.

FIG. 6 is a diagram that depicts an exemplary implementation of a data structure that may be stored in object movement metadata DB 220. As shown, the data structure stored in DB 220 may include multiple entries 600. Each entry 600 may include a real-world road segment ID field 610, a virtual road segment ID field 620, a timestamp field 630, an object type field 640, an object location field 650, and an object velocity field 660.

Real-world road segment ID field 610 stores a unique ID assigned to a real-world road segment 105 that corresponds to the virtual road segment stored in field 620. Virtual road segment ID field 620 stores a unique ID assigned to a virtual road segment generated by cloud server(s) 120 based on location and configuration metadata for the real-world road segment identified in field 610. Timestamp field 630 stores a timestamp associated with a time at which an image was captured at a smart camera 100, and then subsequently analyzed by smart camera 100 to generate either road segment location and configuration metadata 110 or vehicle/pedestrian movement metadata 115. Therefore, a time sequence of images captured at a particular smart camera 100 of a same real-world road segment 105 may be stored in a series of entries 600 of DB 220.

Object type field 640 stores an identifier that identifies the type of object whose movement through the real-world road segment 105 has been analyzed by the smart camera 100 within a captured image. For example, the object type identified stored in field 640 may identify the object as a pedestrian, a vehicle, and may further classify the particular type of vehicle (e.g., truck, recreational vehicle (RV), taxi, bicycle, motorcycle, automobile, semi-truck, etc.). Other types of object classification information may be stored in association with object type field 640 including, for example, a color of the object, a number of passengers of the object, etc. Object location field 650 stores geo-location data associated with the geo-location of the object whose type is identified in field 640. For example, if the object transiting the real-world road segment is an automobile, then field 650 stores the geo-location of the automobile within the captured image analyzed by smart camera 100. Object velocity field 660 stores velocity data (i.e., speed and heading data) associated with the object whose type is identified in field 640. For example, if the object transiting the real-world road segment is a pedestrian, then field 660 stores data indicating a direction and a speed at which the pedestrian transited through/across the road segment.

To locate a particular entry 600, the data structure of DB 220 may be queried with, for example, a virtual road segment ID to locate an entry 600 having a matching virtual road segment ID stored in field 620. When such an entry 600 is located, data may be stored in one or more of fields 610, 620, 630, 40, 650, and/or 660 of the entry 600, or data may be retrieved from one or more of fields 610, 620, 630, 40, 650, and/or 660 of the entry 600. Other fields of an entry 600, instead of virtual road segment ID field 620, may be used for querying data structure 600, such as, for example, real-world road segment ID field 610, timestamp field 630, object type field 640, object location field 650, or object velocity field 660.

DBs 210 and 220 are depicted in FIGS. 5 and 6 as storing tabular data structures having a certain number of fields with certain content. The tabular data structures shown in FIGS. 5 and 6, however, are for illustrative purposes. Other types of data structures may alternatively be used. The number, types, and content of the entries and/or fields in the data structures illustrated in FIGS. 5 and 6 are also for illustrative purposes. Other data structures having different numbers of, types of and/or content of, the entries and/or the fields may be implemented. Therefore, the data structures stored in DBs 210 and 220 may include additional, fewer and/or different entries and/or fields than those depicted in FIGS. 5 and 6. For example, though an entry 600 of the data structure of DB 220 is shown as only including an object type field 640, object location field 650, and an object velocity 660 for a single object transiting a real-world road segment in a particular image captured by a smart camera 100, the entry 600 may include replicated fields 640, 650 and 660 for each of the objects determined to be transiting the real-world road segment within the particular image captured by the smart camera 100. For example, if the particular image captured by a smart camera includes two vehicles and one pedestrian, then fields 640, 650 and 660 can be replicated three times in an entry 600 of the data structure of DB 220 such that the object type, object location, and object velocity of each of the two vehicles and the pedestrian are stored in the entry 600 corresponding to particular image captured at the time indicated by the timestamp stored in field 630.

Figure 7:
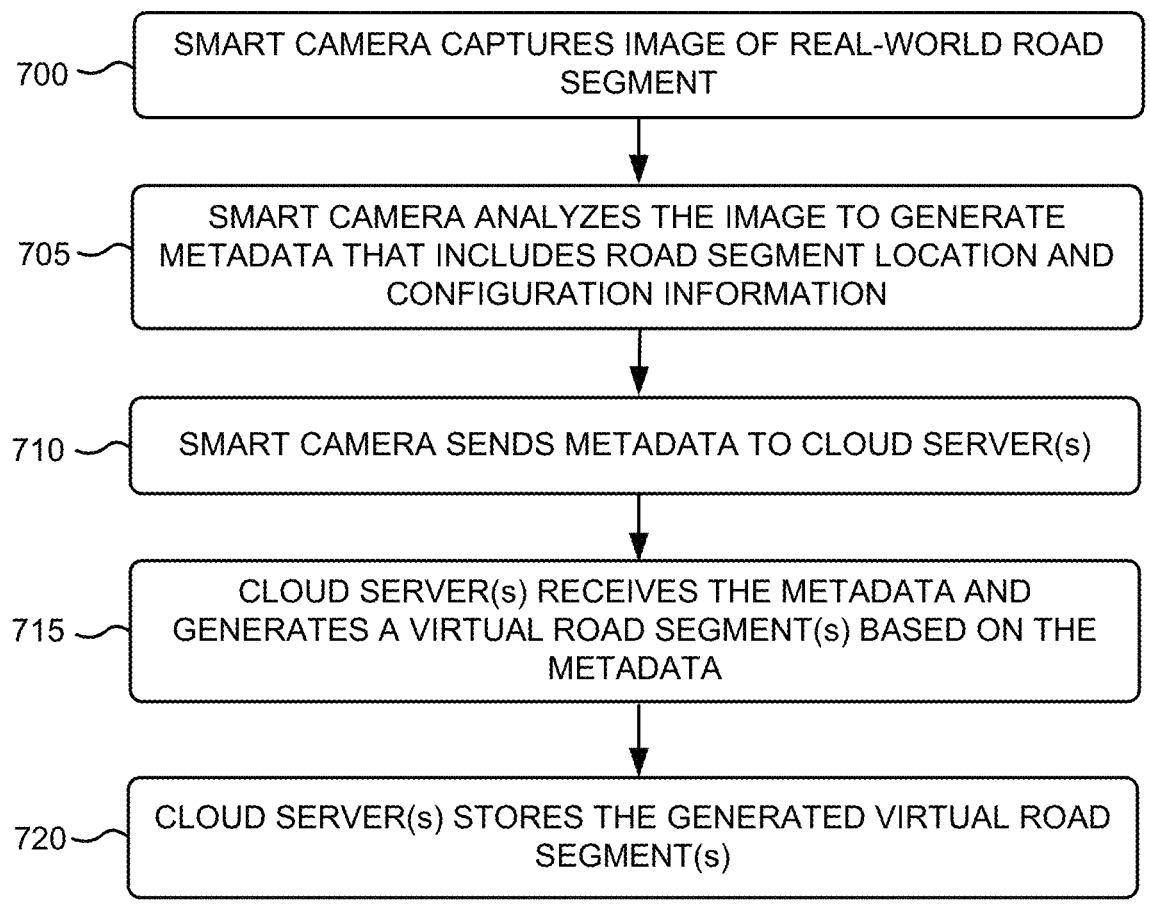
FIG. 7 is a flow diagram of an exemplary process for capturing images of a real-world road segment and analyzing the captured image to generate metadata that describes the road segment location and configuration.

FIG. 7 is a flow diagram of an exemplary process for capturing images of a real-world road segment 105 and analyzing the captured image to generate metadata that describes the road segment location and configuration. In one implementation, the exemplary process of FIG. 7 may be executed by a smart camera 100, disposed at a real-world road segment 105, in conjunction with cloud server(s) 120. The exemplary process of FIG. 7 is described below with reference to the messaging/operations diagram of FIG. 9. The exemplary process of FIG. 7 may be repeated each time camera 100 captures an image of a real-world road segment 105.

The exemplary process includes smart camera 100 capturing an image of a real-world road segment 105 (block 700), and analyzing the image to generate metadata that includes road segment location and configuration information (block 705). The smart camera 100, disposed within a particular real-world road segment 105, and directed to view a particular portion of the real-world road segment 105, may capture an image of the road segment 105 on-demand, or automatically such as, for example, at certain periodic intervals (e.g., every 250 milliseconds). Upon capturing each image, smart camera 100 may temporarily store the image in memory, such as main memory 325, for image processing by processing unit 320. The image processing may include obtaining a geo-location from geo-location device 310 (e.g., GPS coordinates) and determining the geo-location of relevant features captured within the image of the road segment based on the obtained geo-location data. The relevant geographic features of the road segment may include the location and configuration of the lanes of the road segment, the location and configuration of any intersections within the road segment, and the location of traffic signs and traffic signals within the road segment. Other types of road segment location and configuration information may be determined, by smart camera 100, from captured images, and corresponding metadata generated.

Figure 8:
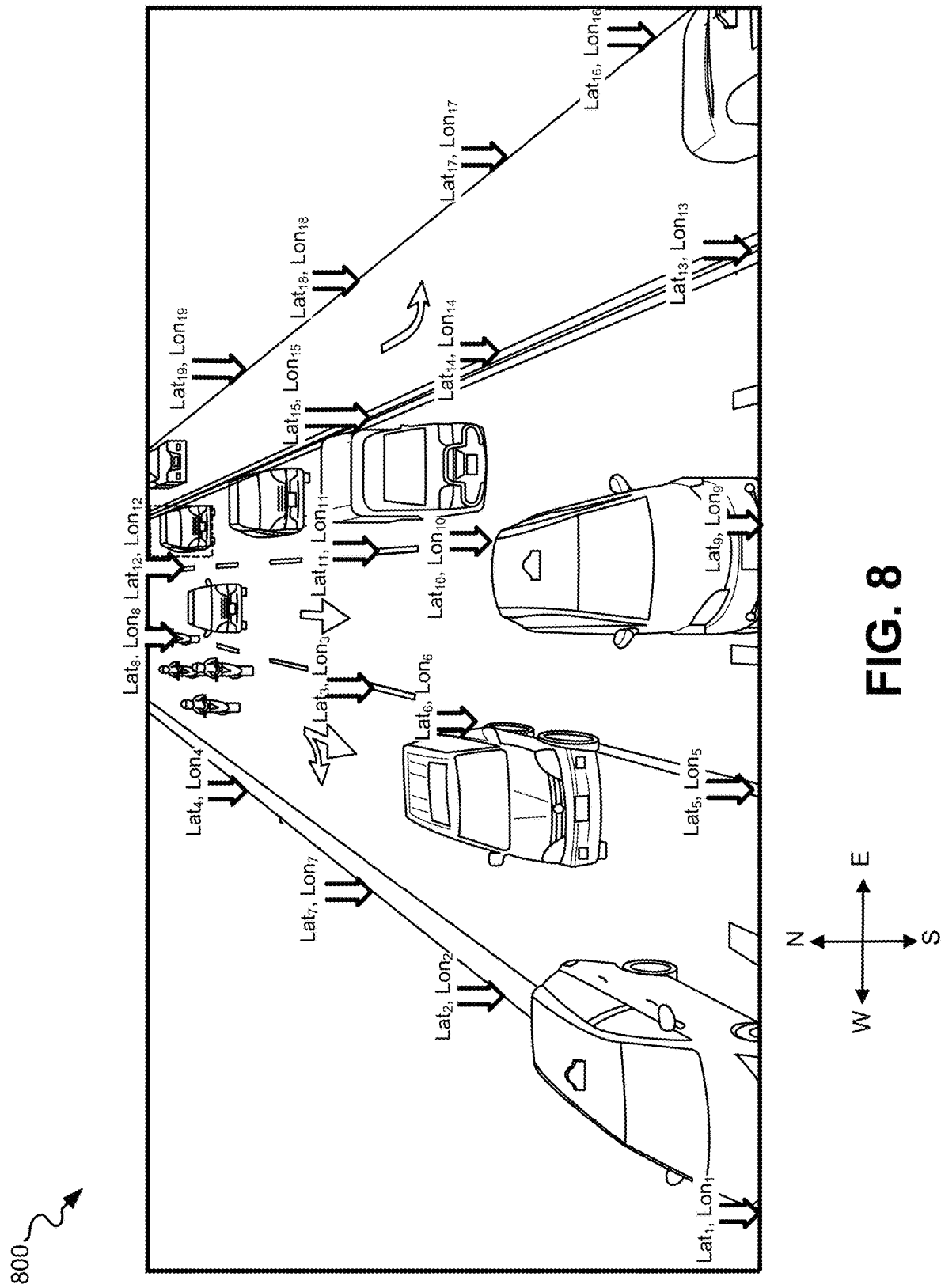
FIG. 8 depicts an exemplary image of a real-world road segment that the smart camera of FIG. 1 analyzes to determine the position coordinates of aspects of the road segment.
Figure 9:
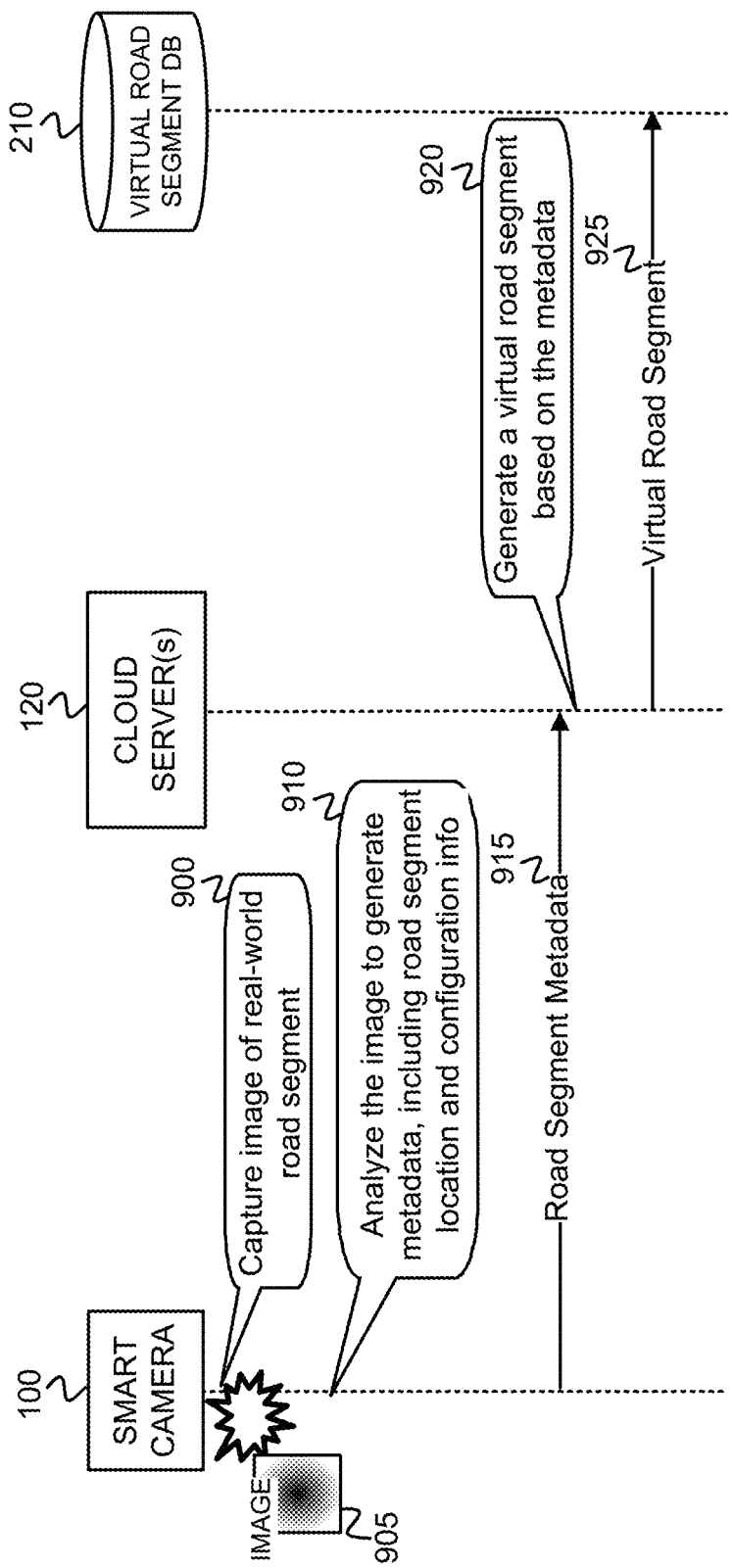
FIG. 9 is a messaging/operations diagram associated with the exemplary process of FIG. 7.

FIG. 8 depicts an exemplary image 800 of a real-world road segment 105 that the smart camera 100 of FIG. 1 analyzes to determine the position coordinates (e.g., latitude, longitude, altitude) of aspects of the road segment such as, for example, the geo-location of the outer edges of the street (i.e., curb location), the geo-location of each lane within the street, the geo-location of turn lanes, the geo-location of medians, the geo-location of intersections and crosswalks, etc. Smart camera 100 may use image analysis and recognition techniques to generate geo-locations, physical dimensions, and configuration metadata for all aspects of the road segment, including traffic signs and traffic signals. FIG. 9 depicts smart camera 100 capturing 900 an image 905 of a real-world road segment (not shown), and analyzing 910 the image to generate metadata, including road segment location and configuration information.

Smart camera 100 sends the metadata to cloud server(s) 120 (block 710), and cloud server(s) 120 receives the metadata and generates a virtual road segment(s) based on the metadata (block 715). In some circumstances, cloud server(s) 120 may divide the real-world road segment into a series of multiple virtual road segments to facilitate the detection of different traffic patterns or events within the different virtual road segments and/or to allow for the parallel processing of object movement metadata within the multiple virtual road segments. Generation of the virtual road segment(s), based on the received location and configuration metadata, may include translation, by cloud server(s) 120, of the road segment location and configuration metadata into a coordinate system that is to be used in the virtual road segment(s) such that the physical dimensions and the configuration of the road segment(s) are defined within the coordinate system. Cloud server(s) 120 may additionally translate the locations of the traffic signage, traffic signals, and roadway lights into the coordinate system when generating the virtual road segment data. Cloud server(s) 120 may generate additional virtual road segment data that describes the level of lighting provided by road segment lights, and the timing of traffic signals located within the road segment 105 (e.g., timing of stop lights). In some implementations, the road segment location and configuration metadata, received from the smart camera 100 by the cloud server(s) 120 in block 710, may alternatively be manually entered, or uploaded to cloud server(s) 120 in a metadata file, instead of generated by the smart camera 100. Road segment location and configuration metadata, manually entered or uploaded via a metadata file, may be used to generate one or more virtual road segments that may further be used during analysis of traffic characteristics, trends, and/or events (as described with respect to block 1420 below).

Figure 10:
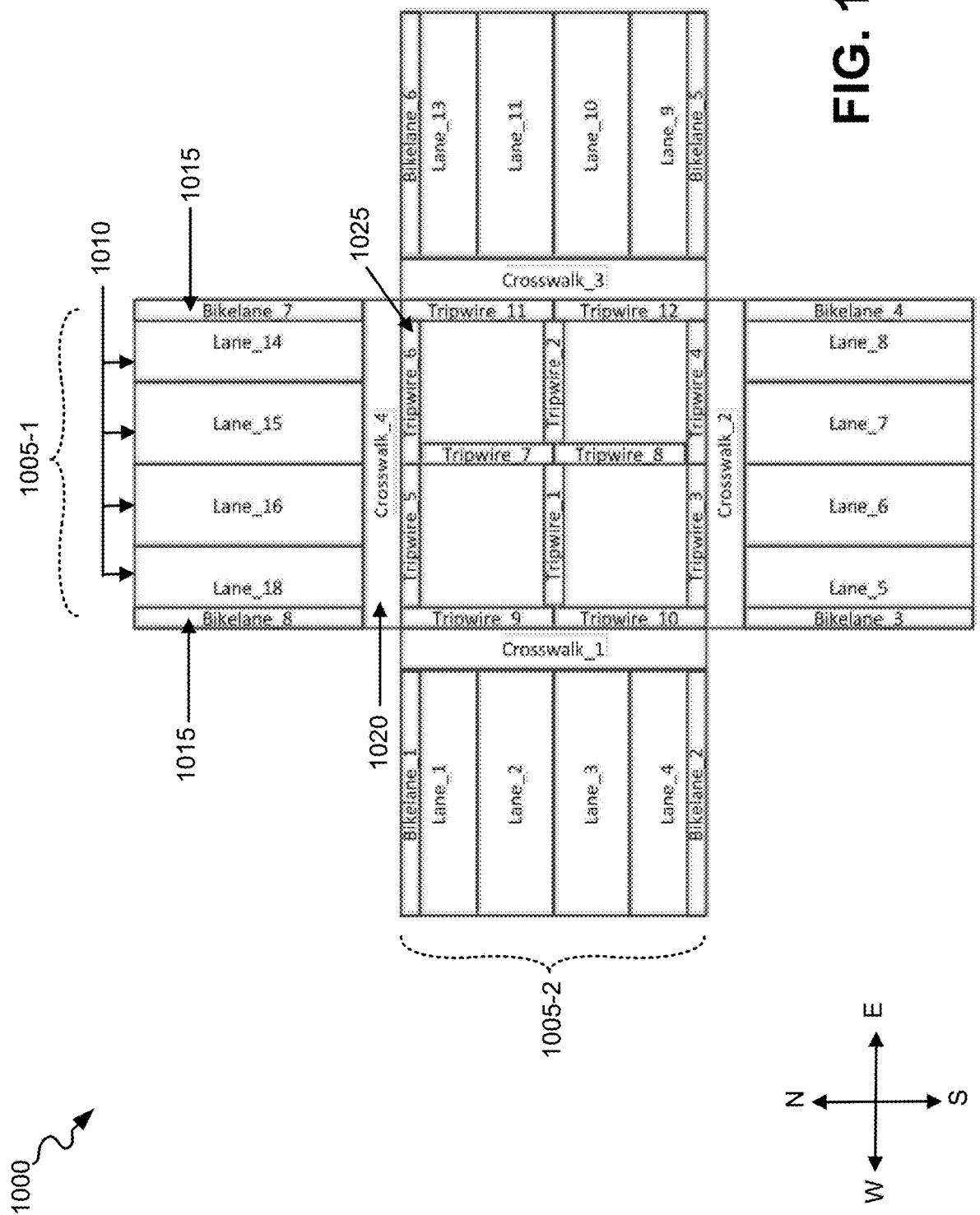
FIG. 10 shows one example of the generation of a virtual road segment, that includes a four-way intersection, based on road segment location and configuration metadata received from a smart camera.

FIG. 10 shows one example of the generation of a virtual road segment, that includes a four-way intersection, based on road segment location and configuration metadata received from a smart camera 100. As shown, the road segment location and configuration metadata can be translated to virtual road segment data that defines two intersecting streets 1005-1 and 1005-2, with each street 1005 having four street lanes 1010, and two bicycle lanes 1015. The road segment location and configuration metadata can also be translated to virtual road segment data that defines the intersection of streets 1005-1 and 1005-2, including pedestrian crosswalks 1020, and intersection tripwires 1025 for determining when and where objects transit through the intersection. The virtual road segment data generated by cloud server(s) 120, based on the road segment location and configuration metadata received from smart camera 100, describes the locations and dimensions of the various portions of the road segment (e.g., the street width, lane width, crosswalk location and width, bicycle lane location and width, street direction of travel, location of street signs, location of traffic signals, traffic signal intervals, etc.) within a reference coordinate system. FIG. 9 depicts smart camera 100 sending road segment metadata 915 to cloud server(s) 120 via network(s) 230 (not shown), and cloud server(s) 120 generating 920 a virtual road segment based on the road segment metadata 915 received from smart camera 100.

Cloud server(s) 120 stores the generated virtual road segment in virtual road segment DB 210 (block 720). Cloud server(s) 120 may store the virtual road segment ID of the generated virtual road segment in field 510, the real-world road segment ID of the corresponding real-world road segment 105 in field 520, the road segment location and configuration metadata in field 530, and the generated virtual road segment data in field 540 of an entry 500 of DB 210. FIG. 9 also depicts cloud server(s) 120 sending the generated virtual road segment 925 to virtual road segment DB 210 for storing in the data structure of DB 210.

Figure 11:
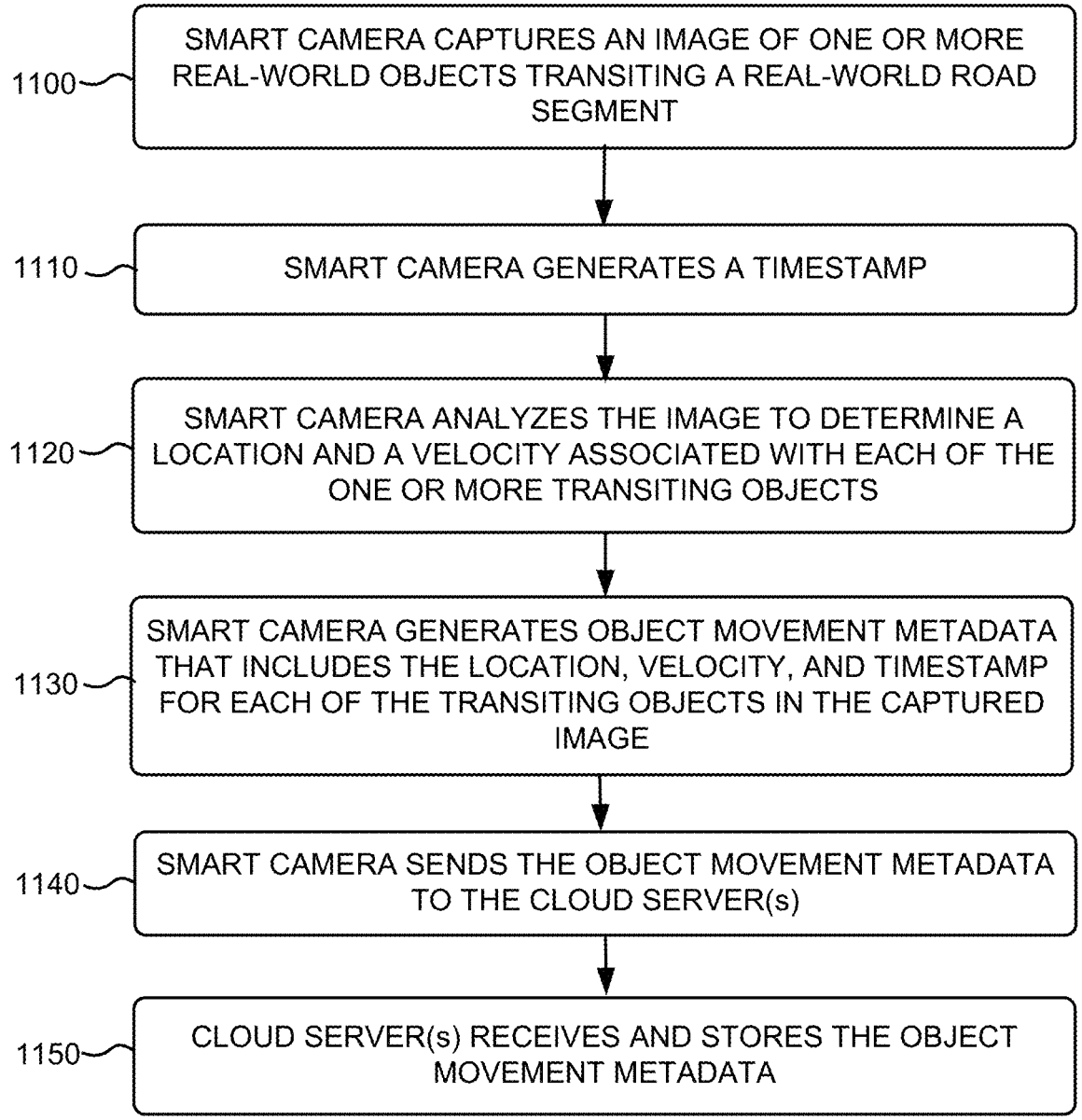
FIG. 11 is a flow diagram of an exemplary process for smart camera analysis of an image to generate metadata that describes the location and velocity of objects transiting a real-world road segment captured in the image.

FIG. 11 is a flow diagram of an exemplary process for smart camera analysis of an image to generate metadata that describes the location and velocity of objects transiting a real-world road segment captured in the image. In one implementation, the exemplary process of FIG. 11 may be executed by smart camera 100 in conjunction with cloud server(s) 120. The exemplary process of FIG. 11 is described below with reference to the image processing example depicted in FIG. 12, and the messaging/operations diagram of FIG. 13. The exemplary process of FIG. 11 may be repeated each time a smart camera 100 captures an image of one or more objects transiting a real-world road segment 105.

Figure 12:
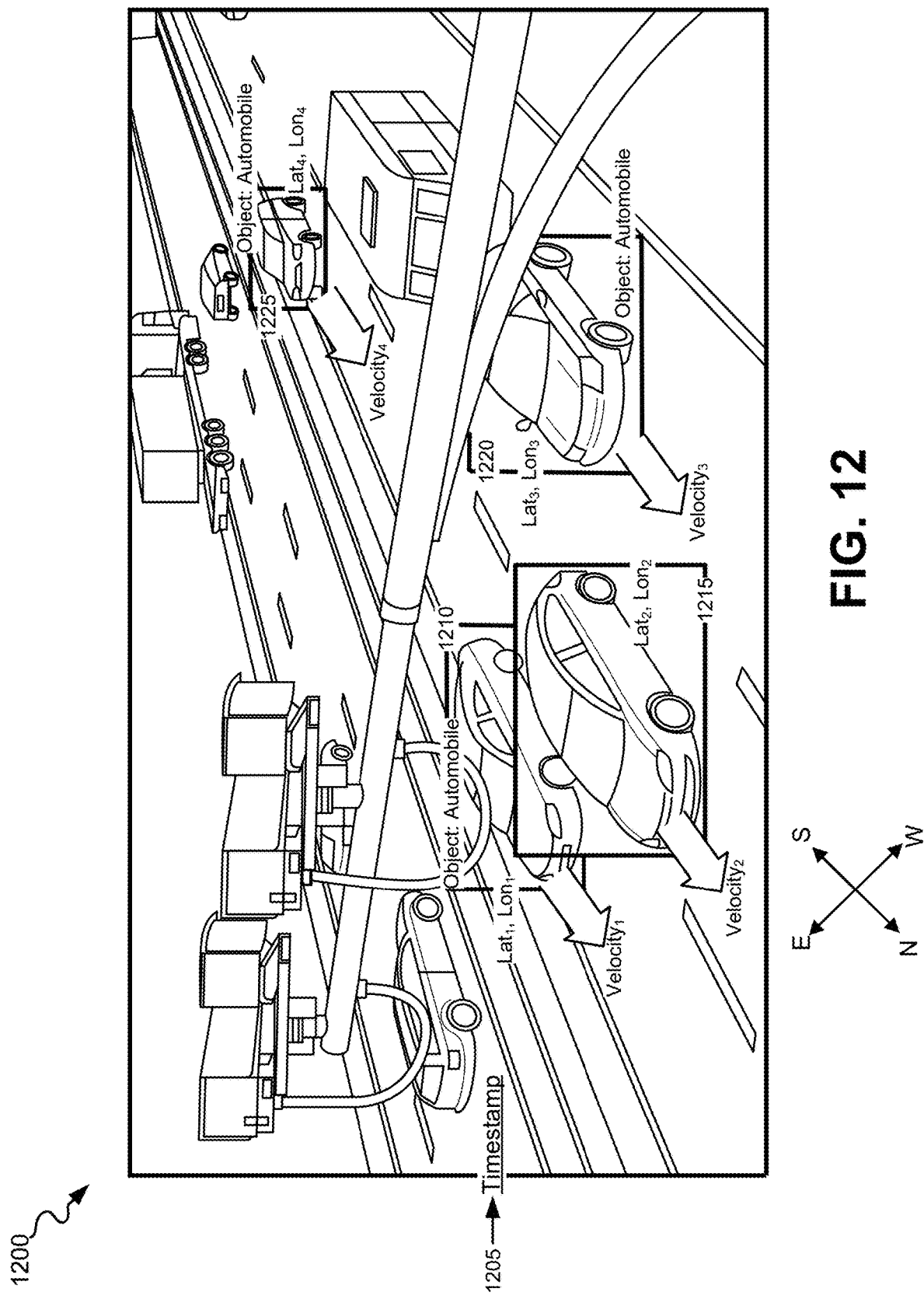
FIG. 12 depicts an example of image analysis of an image of a particular real-world road segment for generating object movement metadata.

The exemplary process includes smart camera 100 capturing an image of a real-world road segment 105 that includes one or more real-world objects transiting the road segment 105 (block 1100), generating a timestamp associated with the captured image (block 1110), and analyzing the image, using image recognition techniques, to determine a location and velocity associated with each of the one or more transiting objects within the captured image (block 1120). In some implementations, the image may be analyzed to additionally determine an object type (e.g., car, truck, RV, taxi, bicycle, motorcycle) associated with each of the one or more objects within the captured image. In other implementations, the image may be analyzed to further determine other metadata associated with classifying one or more aspects of the object including, for example, a color of the object, a number of passengers of the object, etc. FIG. 12 depicts an example of image analysis of an image of a particular real-world road segment 105 for generating object movement metadata. As shown, a timestamp 1205 is associated with the image 1200 that indicates a time (e.g., hour:minute: seconds:milliseconds) at which the image 1200 was captured. Smart camera 100, upon capturing the image 1200, performs image recognition on the image 1200 to identify multiple objects 1210, 1215, 1220, and 1225 within the real-world road segment. For each identified object, smart camera 100, using image recognition techniques, may, in some implementations, identify a type of the object (e.g., automobile, pedestrian, motorcycle, bicycle, etc.). In the example image 1200, objects 1210, 1215, 1220, and 1225 are identified as automobiles.

Additionally, using image recognition techniques, and relating the content of the image 1200 to a known geo-location of the smart camera 100 and a known orientation of the smart camera 100 (i.e., a known direction that the smart camera 100 is pointing), smart camera 100 determines a current geo-location coordinate and a current velocity (i.e., current speed and heading) of each of the automobiles 1210, 1215, 1220, and 1225. Determination of a location of an object within the image 1200 may further include processing of the image by a second camera, that is disposed at a different location relative to the road segment and captures an additional image of the road segment and the object at a same time, and using the results of the processing of the images from both smart cameras 100 to determine the geo-location coordinates of each of the objects (e.g., automobiles 1210, 1215, 1220, and 1225).

Figure 13:
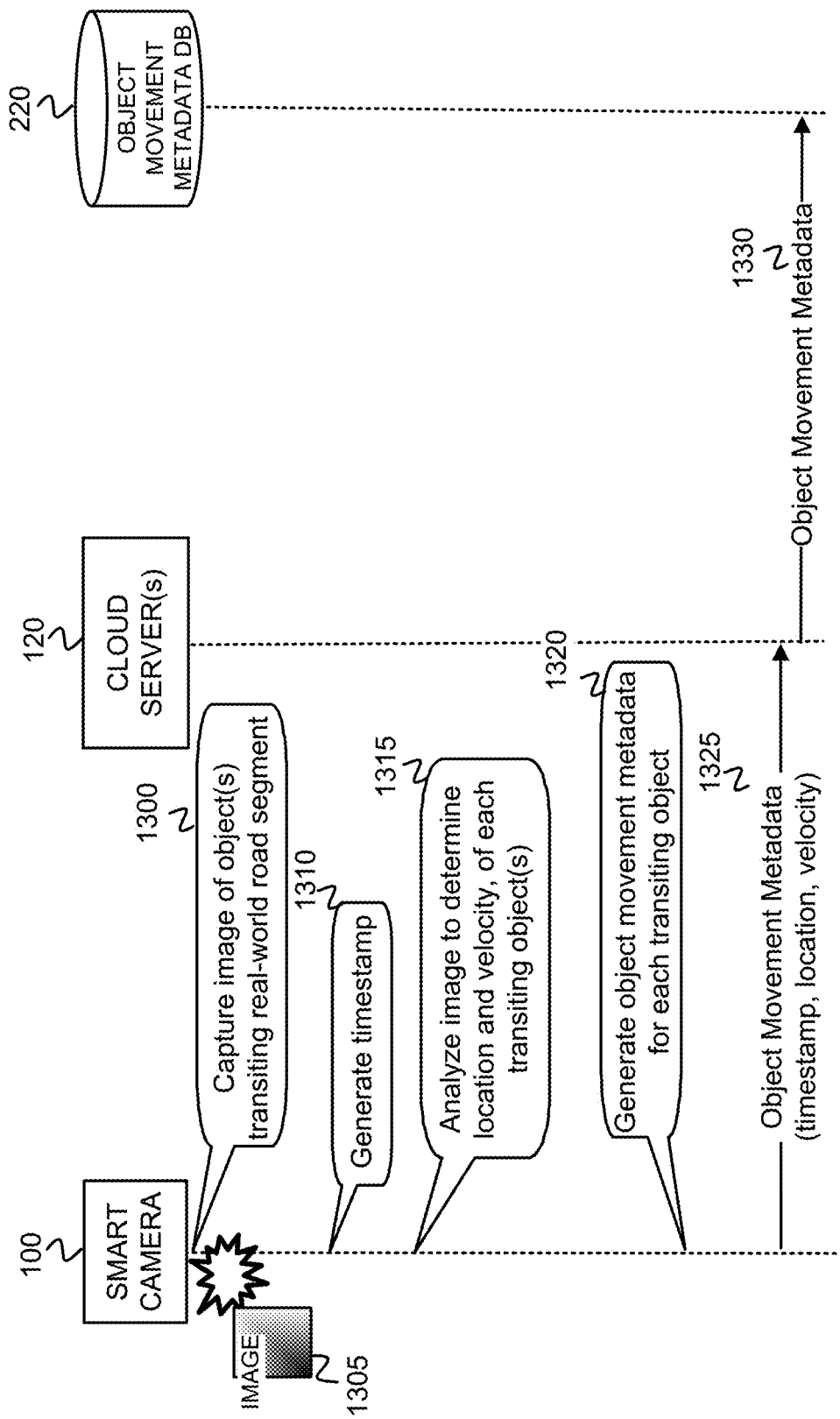
FIG. 13 is a messaging/operations diagram associated with the exemplary process of FIG. 11.

Determination of a current speed may involve smart camera 100 identifying the geo-location of an object in at least two different images separated by a time interval (i.e., timestamp$_i$, timestamp$_{i+1}$), determining the time difference between the timestamps of the different images, and determining the speed of the object based on the distance traveled and the time difference. In the example of FIG. 12, smart camera 100 determines geo-coordinates (e.g., Lat$_1$, Lon$_1$) and a velocity of velocity$_1$ of automobile 1210; geo-coordinates (e.g., Lat$_2$, Lon$_2$) and a velocity of velocity$_2$ of automobile 1215; geo-coordinates (e.g., Lat$_3$, Lon$_3$) and a velocity of velocity$_3$ of automobile 1220; and geo-coordinates (e.g., Lat$_4$, Lon$_4$) and a velocity of velocity$_4$ of automobile 1225. FIG. 13 depicts smart camera 100 capturing an image 1305 of a real-world road segment 105 (not shown) that is being transited by one or more objects (not shown). FIG. 13 further depicts smart camera 100 generating 1310 a timestamp that indicates a time at which the image 1305 was captured by smart camera 100, and analyzing 1315 the image 1305 to determine an object type, and location and velocity, of each transiting object(s) within the real-world road segment captured in the image 1305.

Smart camera 100 generates object movement metadata, that includes the location, velocity, and timestamp for each of the transiting objects in the captured image (block 1130), and sends the object movement metadata to cloud server(s) 120 (block 1140). Smart camera 100, based on results of the image analysis performed in block 1120, generates object movement data that identifies the determined geo-location coordinates, the determined velocity, and the associated timestamp, for each object identified by smart camera 100 within the image captured in block 1100. In other implementations, the object movement metadata may include additional metadata determined from the image analysis, such as object type, object color, number of passengers, etc. FIG. 13 depicts smart camera 100 generating 1320 object movement metadata for each transiting object captured within image 1305, and sending the object movement metadata 1325 to cloud server(s) 120. In some implementations, the object movement metadata, received from the smart camera 100 by the cloud server(s) 120 in block 1140, may alternatively be manually entered, or uploaded to cloud server(s) 120 in a metadata file, instead of generated by the smart camera 100. Object movement metadata, manually entered or uploaded via a metadata file, may be used during analysis of traffic characteristics, trends, and/or events (as described with respect to block 1420 below).

Cloud server(s) 120 receives and stores the object movement metadata in object movement metadata DB 220 (block 1150). Cloud server(s) stores the real-world road segment ID of the particular road segment captured in the image in field 610, the virtual road segment ID of the virtual road segment that corresponds to the real-world road segment in field 620, the timestamp associated with the captured image in field 630, the identified object type in field 640, the determined object location in field 650, and the determined object velocity in field 660 of an entry 600 of DB 220. FIG. 13 depicts cloud server(s) 120 sending the object movement metadata 1330 to DB 220 for storing in a data structure of DB 220.

Figure 14:
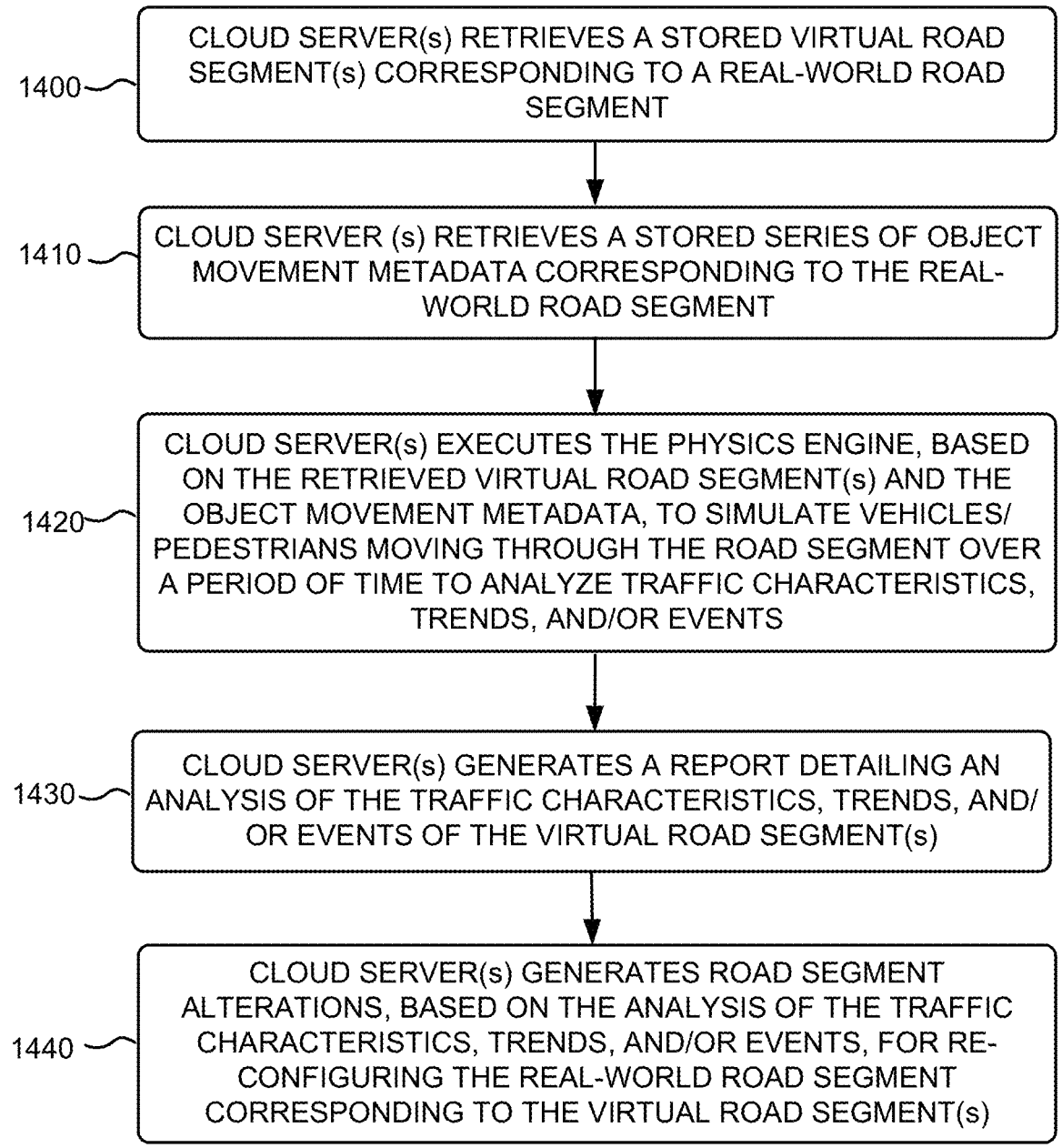
FIG. 14 is a flow diagram of an exemplary process for cloud-based simulation of the movement of vehicles/pedestrians through virtual road segments to analyze traffic characteristics, trends, or events of the virtual road segments.

FIG. 14 is a flow diagram of an exemplary process for cloud-based simulation of the movement of vehicles/pedestrians through virtual road segments to analyze traffic characteristics, trends, or events of the virtual road segments. In one implementation, the exemplary process of FIG. 14 may be executed by cloud server(s) 120. The exemplary process of FIG. 14 is described below with reference to FIGS. 15 and 16.

Figure 15:
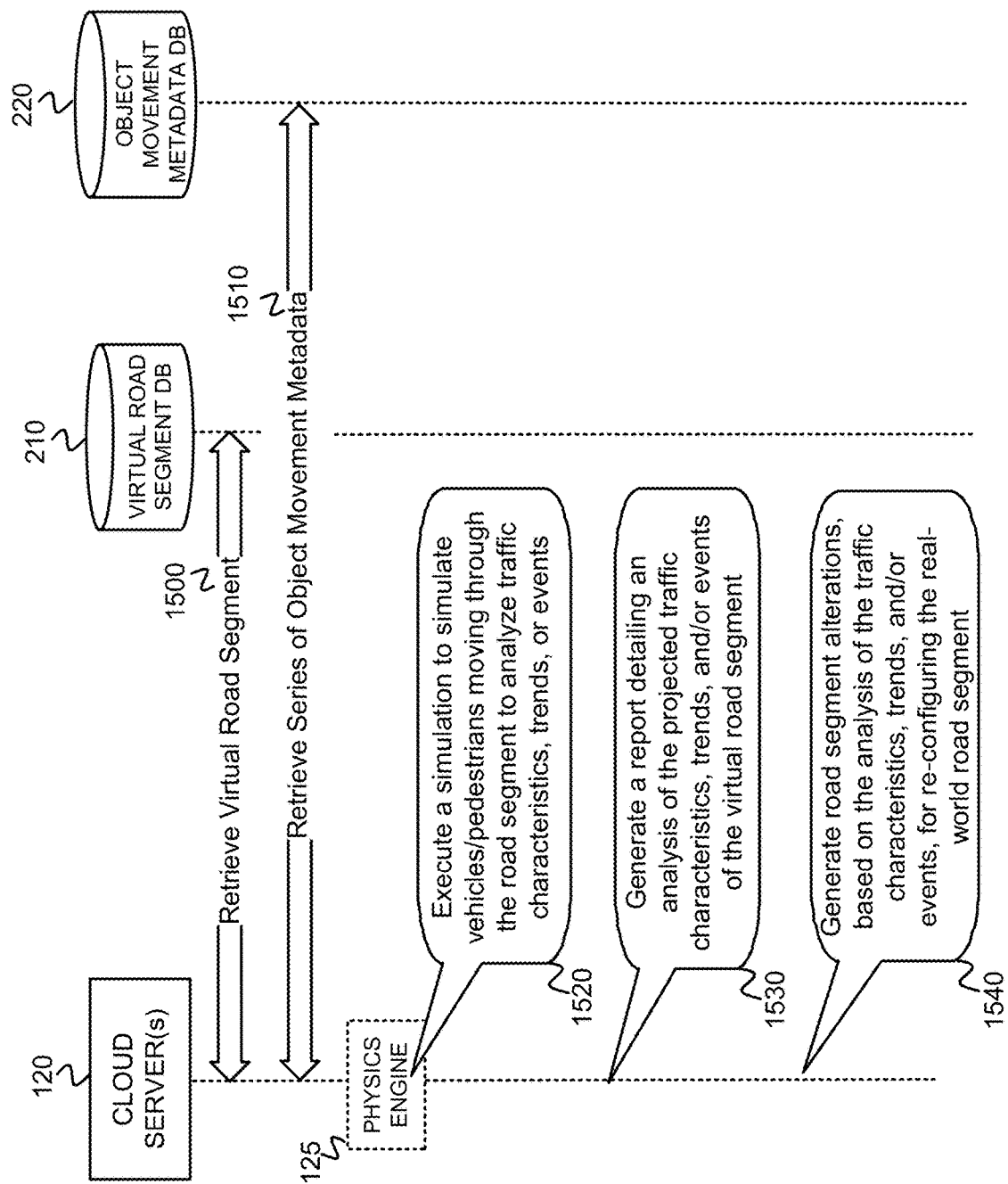
FIG. 15 is a messaging/operations diagram associated with the exemplary process of FIG. 14.

The exemplary process includes cloud server(s) 120 retrieving a stored virtual road segment(s), corresponding to a real-world road segment, from DB 210 (block 1400), and retrieving a stored series of object movement metadata corresponding to the real-world road segment (block 1410). For example, cloud server(s) 120 may query DB 210 with one or more virtual road segment IDs to locate one or more entries 500 having data stored in field 510 that matches the virtual road segment IDs. In some circumstances, a given real-world road segment may correspond to a series of virtual road segments, and each of the stored virtual road segments of the series may be retrieved from DB 210. Alternatively, cloud server(s) 120 may query DB 210 with a real-world road segment ID to locate one or more entries 500 having data stored in field 520 that matches the real-world road segment ID. Upon locating the one or more entries 500 of DB 210, cloud server(s) 120 may retrieve virtual road segment data stored in field(s) 540 of the located entry/entries 500. Additionally, to retrieve the stored series of object movement metadata, cloud server(s) 120 may query DB 220 with the virtual road segment ID to locate entries 600 having data stored in field 620 that matches the virtual road segment ID. Once the multiple entries 600 are located in DB 220, cloud server(s) 120 may compare the timestamp data stored in field 630 of each entry to further locate the particular entries having object movement metadata within a particular time range, or multiple time ranges. For example, cloud server(s) 120 may query DB 220 for object movement metadata obtained for a particular virtual road segment on a particular day (e.g., May 8, 2017), in a particular interval of time (e.g., from 12:00 pm to 12:10 pm), or particular intervals of time (e.g., from 8:05 am to 8:15 am, from 11:21 am to 11:25 am, from 3:46 pm to 3:55 pm, etc.). FIG. 15 depicts cloud server(s) 120 retrieving 1500 a virtual cloud segment from DB 210, and retrieving 1510 a series of object movement metadata from DB 220.

In some implementations, the stored virtual road segment(s) may not exactly correspond to a real-world road segment, but may include a virtual road segment(s) having modifications in its configuration relative to the corresponding real-world road segment. Historic object movement metadata for the real-world road segment may then be used by physics engine 125, in addition to the modified virtual road segment, to analyze for particular traffic characteristics, trends, and/or events, as described with respect to blocks 1420 and 1430 below, that may occur within the modified virtual road segment(s). The modified virtual road segment(s) may, therefore, be used, during analysis by physics engine 125, to detect new or different traffic patterns, trends, or events.

Cloud server(s) 120 executes physics engine 125, based on the retrieved virtual road segment(s) and the object movement metadata, to simulate vehicles and/or pedestrians moving through the road segment(s) over a period of time to analyze traffic characteristics, trends, and/or events (block 1420). Physics engine 125 may execute algorithms that simulate classical mechanics (i.e., kinematics) as applied to the retrieved object movement data for the virtual road segment(s) for an analysis of the traffic characteristics, trends, and/or events within the virtual road segment(s). The retrieved object movement data used for analyzing traffic characteristics, trends, and/or events may include contemporaneous object movement data (i.e., occurring in real-time, or near real-time) for one or more moving objects, a single instance of object movement data (i.e., a single instance of past movement of an object), or historic object movement metadata that includes multiple instances of object movement (i.e., multiple instances of past movement of objects within the road segment). Physics engine 125 may, for example, generate simulations of specific scenarios occurring within a virtual road segment(s), involving vehicles or pedestrians. The specific scenarios that are simulated may include, but are not limited to, a vehicle turning from a left turn lane, a vehicle making a U-turn at an intersection, a vehicle yielding or not yielding to a pedestrian in an intersection crosswalk, and a vehicle exceeding the speed limit through a virtual road segment with particular, repeating traffic signaling. Any type of scenario involving one or more vehicles (e.g., automobiles, bicycles, motorcycles, trucks), and/or one or more pedestrians may be simulated by physics engine 125 based on the retrieved virtual road segment data and the retrieved series of object movement metadata. FIG. 15 depicts physics engine 125 of cloud server(s) 120 executing 1520 a simulation to simulate vehicles/pedestrians moving through the virtual road segment to analyze traffic characteristics, trends, or events.

Physics engine 125 may execute algorithms that use the object movement data and the virtual road segment(s) to analyze for the occurrence of particular events, such as cars not yielding to pedestrians or bicycles, vehicles driving outside of permissible movement areas (e.g., driving a wrong way on a directional lane, driving on sidewalk, etc.), pedestrians or bicycles moving into or through predefined areas, motorcycles moving into or through predefined areas, etc. To analyze for the occurrence of particular events, two-dimensional geometric areas (e.g., circular "bubbles," polygons) may be defined around pedestrians or vehicles, or around or in the vicinity of features in, on, near, or part of, the roadway such as around bike lanes, sidewalks, buildings, car lanes, traffic islands, grassy areas, or crosswalks. The geometric areas may have dimensions that are specified based on a type of event that the physics engine 125 may be analyzing for an occurrence. When a vehicle penetrates one of these defined geometric areas, a type of event may be generated and noted by cloud server(s) 120. For example, if the physics engine 125 detects that a car penetrates into a circular bubble defined around a pedestrian, a bicycle, or a motorcycle, engine 125 generates a near-miss event. As another example, when geometric areas (e.g., polygons) are defined around features, such as bike lanes, sidewalks, crosswalks, or traffic islands, and a vehicle penetrates into one of the geometric areas, physics engine 125 generates an event that is noted by cloud server(s) 120. As a further example, when geometric areas are defined around features, such bike lanes, sidewalks, crosswalks, or traffic islands, and a pedestrian, bicycle, or motorcycle penetrates into one of the geometric areas, physics engine 125 generates an event that is noted by cloud server(s) 120.

Figure 16:
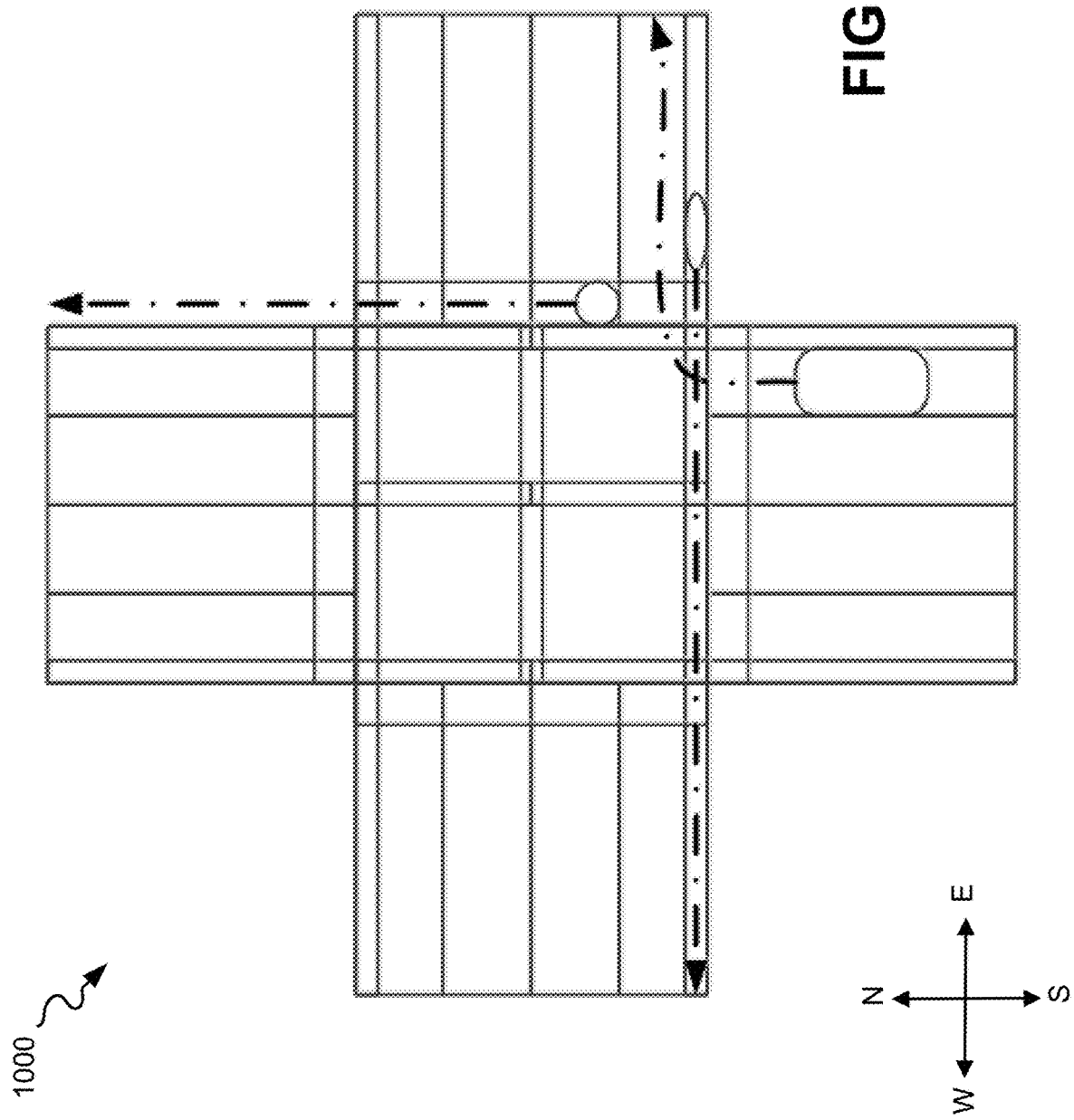
FIG. 16 shows one example of the simulation of object movement within the virtual road segment of FIG. 10 based on retrieved virtual road segment data and object movement metadata.

FIG. 16 shows an example of a physics simulation of the virtual road segment 1000 of FIG. 10 performed based on the object movement metadata retrieved from DB 220. In the example shown, a right turn of an automobile 1600, an intersection crossing of a bicycle 1605, and an intersection crossing of a pedestrian 1610 are simulated. The simulation(s) may, for example, include varying the intervals of traffic signaling in the intersection, varying the timing and speed of the right turn of the automobile 1600, varying the timing and speed of the bicycle 1605 intersection crossing, and/or varying the timing and speed of the pedestrian 1610 intersection crossing. Varying different parameters of the simulation (e.g., timing, speed, etc.) enables the physics engine 125 to analyze different characteristics, trends, and/or events of the virtual road segment.

Cloud server(s) 120 generates a report detailing an analysis of the traffic characteristics, trends, and/or events of the virtual road segment(s) (block 1430). The generated report may include details of the scenario being simulated; movement information regarding vehicles and/or pedestrians driving, walking, or remaining stationary within the virtual road segment; and details of particular characteristics, trends, and/or events that result from an analysis of the simulation by physics engine 125. Cloud server(s) 120 may, based on the analysis performed by physics engine 125, identify the occurrence of particular events on, or in the vicinity of, the virtual road segment(s) being analyzed. For example, cloud server(s) 120 may identify a left turn event involving a vehicle turning left at a particular intersection of a virtual road segment, or a "near miss" event occurring in a virtual road segment involving a vehicle almost colliding with another vehicle, pedestrian, or bicycle. The identified occurrence of particular events may be used as an input to further analysis by physics engine 125 to possibly detect more complex traffic patterns or events. FIG. 15 depicts cloud server(s) generating 1530 a report detailing an analysis of the projected traffic characteristics, trends, and/or events of the virtual road segment.

Cloud server(s) 120 generates road segment alterations, based on the analysis of the traffic characteristics, trends, and/or events, for reconfiguring the real-world road segment corresponding to the virtual road segment(s) (block 1440). The traffic characteristics, trends, and/or events that result from the analysis of the simulation may enable cloud server(s) 120 to identify, using, for example, an expert system and knowledgebase, deficiencies in the road segment configuration such as, for example, the number of lanes, the number of turn lanes, the timing interval(s) of traffic signaling within the road segment, the existence of or lack of particular traffic signs within the road segment, etc. Through use of the expert knowledgebase of the expert system, any type of deficiency within a particular road segment may be identified by cloud server(s) 120 based on the analysis of the virtual road segment simulation. FIG. 15 depicts cloud server(s) 120 generating 1540 road segment alterations, based on the analysis of the traffic characteristics, trends, and/or events, for reconfiguring the real-world road segment.

Figure 17:
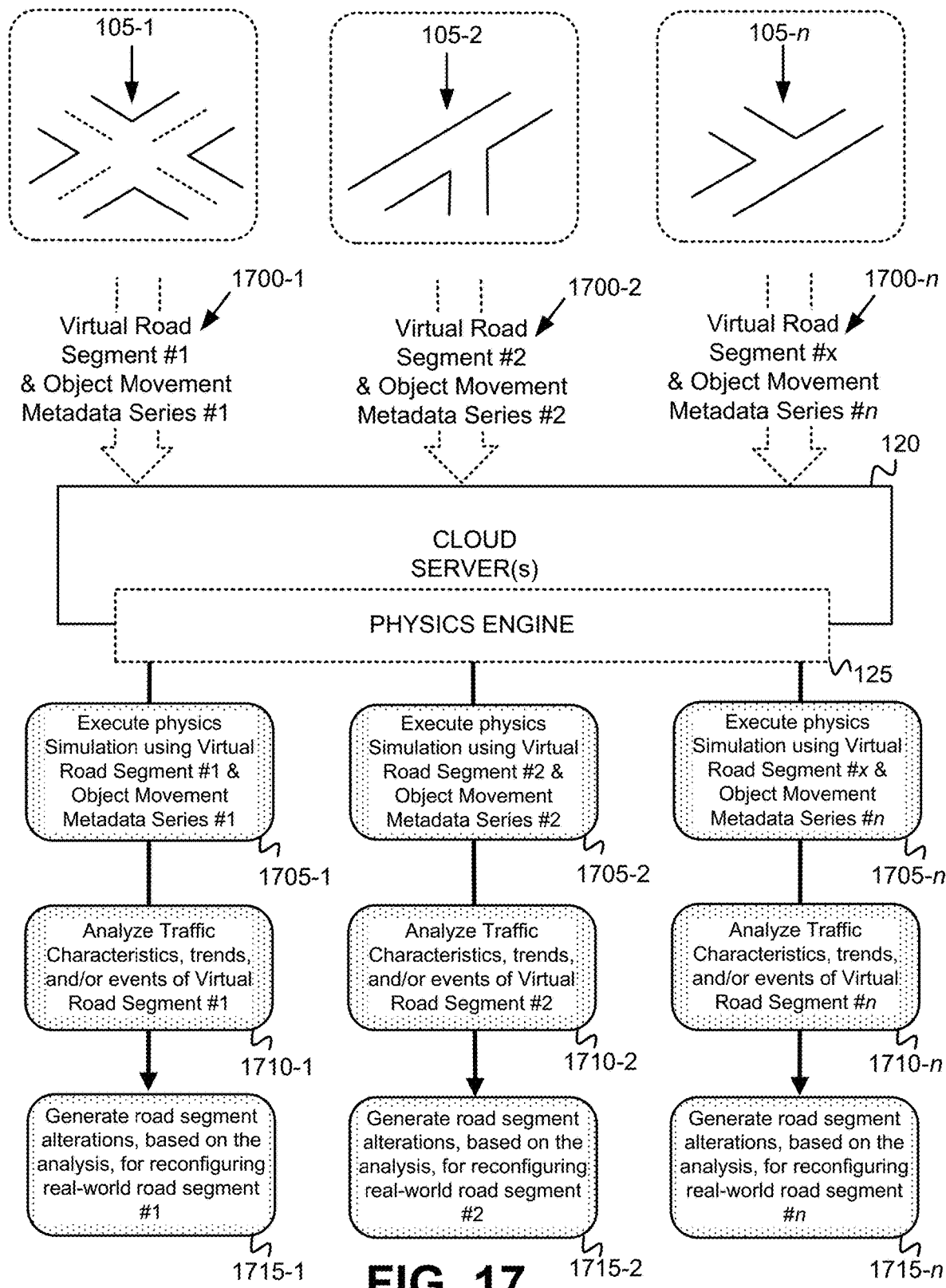
FIG. 17 is a diagram depicting cloud-based simulation of multiple virtual road segments, corresponding to multiple different real-world road segments, based on real-world object movement metadata received from smart cameras at the multiple real-world road segments.

FIG. 17 is a diagram depicting cloud-based simulation of multiple virtual road segments, corresponding to multiple different real-world road segments 105-1 through 105-n, based on real-world object movement metadata received from smart cameras 100 disposed at the multiple real-world road segments 105. Cloud server(s) 120 retrieves virtual road segment data, and series of object movement metadata, from DBs 210 and 220 (not shown in FIG. 17). For example, as shown, cloud server(s) 120 retrieves virtual road segment #1 and object movement metadata series #1 1700-1 for performing a first simulation relating to real-world road segment 105-1. Cloud server(s) 120 further retrieves virtual road segment #2 and object movement metadata series #2 1700-2 for performing a second simulation relating to real-world road segment 105-2. Cloud server(s) 120 additionally retrieves virtual road segment #n and object movement metadata series #n 1700-n for performing an nth simulation relating to real-world road segment 105-n.

Upon retrieval of the virtual road segments and object movement metadata series, physics engine 125 of cloud server(s) 120 executes a first physics simulation 1705-1 using virtual road segment #1 and object movement metadata series #1. Physics engine 125 further executes a second physics simulation 1705-2 using virtual road segment #2 and object movement metadata series #2. Physics engine 125 additionally executes an nth physics simulation 1705-n using virtual road segment #n and object movement metadata series #n. In one implementation, physics engine 125 may execute the first physics simulation 1705-1, the second physics simulation 1705-2, and the nth physics simulation as parallel processes.

Physics engine 125, in conjunction with an expert system having an expert knowledgebase (not shown), performs an analysis 1710-1 of the traffic characteristics, trends, and/or events of virtual road segment #1. Physics engine 125, further in conjunction with the expert system, performs an analysis 1710-2 of the traffic characteristics, trends, and/or events of virtual road segment #2. Additionally, physics engine 125, in conjunction with the expert system, performs an analysis 1710-n of the traffic characteristics, trends, and/or events of virtual road segment #n. In one implementation, physics engine 125 may execute the analyses 1710-1, 1710-2, and 1710-n as parallel processes.

Physics engine 125, in conjunction with the expert system and expert knowledgebase (not shown), generates road segment alterations 1715-1, based on the analysis 1710-1, for reconfiguring real-world road segment #1. Physics engine 125, further in conjunction with the expert system and expert knowledgebase, generates road segment alterations 1715-2, based on the analysis 1710-2, for reconfiguring real-world road segment #2. Physics engine 125, in conjunction with the expert system and expert knowledgebase (not shown), generates road segment alterations 1715-n, based on the analysis 1710-n, for reconfiguring real-world road segment #n. The expert system and expert knowledgebase may generate proposed alterations for reconfiguring the real-world road segments #1 through #n based on identifying any type of deficiency in the road segment determined from the analyses 1710-1 through 1710-n. The proposed alterations for reconfiguring the road segment may include, for example, increasing a number of travel lanes, adding a turn lane(s) or increasing the number of turn lanes, changing the timing interval(s) of traffic signaling within the road segment, adding, changing or removing particular traffic signs within the road segment, and/or increasing or decreasing the speed limit applied to the road segment.

Data sources, other than virtual road segment data and object movement data retrieved in blocks 1400 and 1410, may additionally be used for analyzing the traffic characteristics, trends, and/or events of block 1420, for generating the analysis report of block 1430, or for generating the road segment alterations of block 1440. For example, network connected devices, other than smart cameras 100, may be used to obtain data related to a particular real-world road segment, such as, for example, network connected weather instruments that detect various types of environmental parameters (e.g., temperature, humidity, precipitation, etc.) at a real-world road segment, or light sensors that detect a current lighting level (e.g., darkness, overcast, sunrise, sunset, etc.) at the real-world road segment. As another example, weather forecasting data for a location, weather historical data for a location, mass transmit scheduling information, local event information and/or other types of information may be obtained from published data sources (e.g., on-line databases) and used during analysis, reporting, or road segment alteration generation. As a further example, traffic signaling state information may be used to identify a particular state traffic signaling is/was in (e.g., color of a traffic stop light, such as red, yellow, or green) at the time a pedestrian or vehicle movement, or other event, occurred. The traffic signaling state information may be obtained in real-time, from network connected traffic cameras, or may be obtained from a published timing loop that indicates the signaling phase(s) of traffic signals within a roadway segment(s).

The foregoing description of implementations provides illustration and description, but is not intended to be exhaustive or to limit the invention to the precise form disclosed. Modifications and variations are possible in light of the above teachings or may be acquired from practice of the invention. For example, while series of blocks have been described with respect to FIGS. 7, 11, and 14, and operation/message flows with respect to FIGS. 9, 13, and 15, the order of the blocks and/or operation/message flows may be varied in other implementations. Moreover, non-dependent blocks may be performed in parallel.

Certain features described above may be implemented as "logic" or a "unit" that performs one or more functions. This logic or unit may include hardware, such as one or more processors, microprocessors, application specific integrated circuits, or field programmable gate arrays, software, or a combination of hardware and software.

No element, act, or instruction used in the description of the present application should be construed as critical or essential to the invention unless explicitly described as such. Also, as used herein, the article "a" is intended to include one or more items. Further, the phrase "based on" is intended to mean "based, at least in part, on" unless explicitly stated otherwise.

To the extent the aforementioned embodiments collect, store, or employ personal information of individuals, it should be understood that such information shall be collected, stored, and used in accordance with all applicable laws concerning protection of personal information. Additionally, the collection, storage, and use of such information can be subject to consent of the individual to such activity, for example, through well known "opt-in" or "opt-out" processes as can be appropriate for the situation and type of information. Storage and use of personal information can be in an appropriately secure manner reflective of the type of information, for example, through various encryption and anonymization techniques for particularly sensitive information.

In the preceding specification, various preferred embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

What is claimed is:

1. A method, comprising:
    receiving, at a network device and from a plurality of smart cameras located at different road segments of a plurality of real-world road segments, first data describing a location and configuration of each of the plurality of real-world road segments, wherein the configuration includes physical dimensions of lanes;
    receiving, at the network device from the plurality of smart cameras, second data describing movement of real-world objects comprising vehicles, motorcycles, bicycles and pedestrians at each of the plurality of real-world road segments;
    generating, by the network device, a plurality of virtual road segments based on the first data, wherein each of the plurality of virtual road segments describes one of the plurality of real-world road segments and one of the plurality of real-world road segments is described by at least two virtual road segments;
    executing, by the network device, a physics engine to simulate, based on the generated plurality of virtual road segments and the second data, movement of objects through the plurality of real-world road segments to analyze traffic characteristics, trends and events;
    executing, by the network device, an expert system, wherein the expert system, using an expert knowledgebase, evaluates a configuration of one or more of the plurality of real-world road segments and determines an existence of deficiencies that impact vehicle or pedestrian safety, in the configuration of the one or more of the plurality of real-world road segments based on the analysis of the traffic characteristics, trends, and events associated with the one or more of the plurality of real-world road segments; and
    generating, by the expert system using the expert knowledgebase, road segment alterations for reconfiguring the one or more of the plurality of real-world road segments to address the deficiencies that impact vehicle or pedestrian safety determined to exist, by the expert system, in the configuration of the one or more of the plurality of real-world road segments.

2. The method of claim 1, further comprising:
    storing, by the network device, the first data in a first database;
    storing, by the network device, data associated with the generated plurality of virtual road segments in the first database,
    wherein generating the plurality of virtual road segments based on the first data comprises:
        retrieving, by the network device, the stored first data from the first database, and
        defining, by the network device, each of the plurality of virtual road segments using the road segment location and configuration described by the first data.

3. The method of claim 1, further comprising:
    storing the second data in a second database;
    wherein executing, by the network device, the physics engine to simulate the movement of the objects through the plurality of real-world road segments comprises:
        retrieving the stored second data from the second database, and executing the physics engine using the second data to simulate the movement of objects through the plurality of real-world road segments, and analyzing, based on the simulated movement, traffic characteristics, trends, or events associated with each of the plurality of real-world road segments.

4. The method of claim 1, further comprising:

generating, by the network device, a report detailing the analysis of the traffic characteristics, trends, and/or events of the plurality of real-world road segments.

5. The method of claim 1, wherein receiving the second data describing movement of the real-world objects at each of the plurality of real-world road segments comprises:

receiving, at the network device from the plurality of smart cameras, the second data, including associated first timestamps, describing the movement of the real-world objects at each of the plurality of real-world road segments at a first time; and receiving, at the network device from the plurality of smart cameras, the second data, including associated second timestamps, describing the movement of the real-world objects at each of the plurality of real-world segments at a second time that is different than the first time.

6. The method of claim 5, wherein executing, by the network device, the physics engine to simulate the movement of the objects through the plurality of virtual road segments comprises:

simulating the movement of the objects through the plurality of real-world road segments further based on the first timestamps and the second timestamps.

7. The method of claim 1, wherein when generating road segment alterations, the expert system is configured to identify at least one of increasing a number of travel lanes, adding a turn lane, increasing a number of turn lanes, changing a timing interval of a traffic signal, adding a traffic sign, changing a traffic sign, removing a traffic sign, increasing the speed limit or decreasing the speed limit.

8. A network device, comprising:

a communication interface connected to a network and configured to:

receive, from a plurality of smart cameras located at different road segments of a plurality of real-world road segments, first data describing a location and configuration of each of the plurality of real-world road segments, wherein the configuration includes physical dimensions of lanes, and receive, from the plurality of smart cameras, second data describing movement of real-world objects comprising vehicles, motorcycles, bicycles and pedestrians at each of the plurality of real-world road segments; and a processing unit configured to:

generate a plurality of virtual road segments based on the first data, wherein each of the plurality of virtual road segments describes one of the plurality of real-world road segments and one of the plurality of real-world road segments is described by at least two virtual road segments, execute a physics engine to simulate, based on the generated plurality of virtual road segments and the second data, movement of objects through the plurality of real-world road segments to analyze traffic characteristics, trends or events, execute an expert system, wherein the expert system, using an expert knowledgebase, evaluates a configuration of one or more of the plurality of real-world road segments and determines an existence of deficiencies that impact vehicle or pedestrian safety, in the configuration of the one or more of the plurality of real-world road segments based on the analysis of the traffic characteristics, trends, or events associated with the one or more of the plurality of real-world road segments, and generate, by the expert system using the expert knowledgebase, road segment alterations for reconfiguring the one or more of the plurality of real-world road segments to address the deficiencies that impact vehicle or pedestrian safety determined to exist, by the expert system, in the configuration of the one or more of the plurality of real-world road segments.

9. The network device of claim 8, wherein the processing unit is further configured to:

store the first data in a first database, store data associated with the generated plurality of virtual road segments in the first database, wherein, when generating the plurality of virtual road segments based on the first data, the processing unit is further configured to:

retrieve the stored first data from the first database, and define each of the plurality of virtual road segments using the road segment location and configuration described by the first data.

10. The network device of claim 8, wherein the processing unit is further configured to:

store the second data in a second database, wherein, when executing the physics engine to simulate the movement of objects through the plurality of real-world road segments, the processing unit is further configured to:

retrieve the stored second data from the second database, execute the physics engine using the second data to simulate the movement of objects through the plurality of real-world road segments, and analyze, based on the simulated movement, traffic characteristics, trends, or events associated with each of the plurality of real-world road segments.

11. The network device of claim 8, wherein the processing unit is further configured to:

generate a report detailing the analysis of the traffic characteristics, trends, and/or events of the plurality of real-world road segments.

12. The network device of claim 8, wherein, when receiving the second data describing movement of real-world objects at each of the plurality of real-world road segments, the processing unit is further configured to:

receive, from the plurality of smart cameras, the second data, including associated first timestamps, describing the movement of the real-world objects at each of the plurality of real-world road segments at a first time, and receive, from the plurality of smart cameras, the second data, including associated second timestamps, describing the movement of the real-world objects at each of the plurality of real-world segments at a second time that is different than the first time.

13. The network device of claim 12, wherein, when executing the physics engine to simulate the movement of the objects through the plurality of real-world road segments, the processing unit is further configured to:

simulate the movement of the objects through the plurality of real-world road segments further based on the first timestamps and the second timestamps.

14. The network device of claim 8, wherein when generating road segment alterations, the expert system is configured to identify at least one of increasing a number of travel lanes, adding a turn lane, increasing a number of turn lanes, changing a timing interval of a traffic signal, adding a traffic sign, changing a traffic sign, removing a traffic sign, increasing the speed limit or decreasing the speed limit.

15. A non-transitory storage medium storing instructions executable by a network device, wherein the instructions comprise instructions to cause the network device to:
receive, from a plurality of smart cameras located at different road segments of a plurality of real-world road segments, first data describing a location and configuration of each of the plurality of real-world road segments, wherein the configuration includes physical dimensions of lanes;
receive, from the plurality of smart cameras, second data describing movement of real-world objects comprising vehicles, motorcycles, bicycles and pedestrians at each of the plurality of real-world road segments;
generate a plurality of virtual road segments based on the first data, wherein each of the plurality of virtual road segments describes one of the plurality of real-world road segments and one of the plurality of real-world road segments is described by at least two virtual road segments;
execute a physics engine to simulate, based on the generated plurality of virtual road segments and the second data, movement of objects through the plurality of real-world road segments to analyze traffic characteristics, trends or events;
execute an expert system, wherein the expert system, using an expert knowledgebase, evaluates a configuration of one or more of the plurality of real-world road segments and determines an existence of deficiencies that impact vehicle or pedestrian safety, in the configuration of the one or more of the plurality of real-world road segments based on the analysis of the traffic characteristics, trends, or events associated with the one or more of the plurality of real-world road segments, and
generate, by the expert system using the expert knowledgebase, road segment alterations for reconfiguring the one or more of the plurality of real-world road segments to address the deficiencies that impact vehicle or pedestrian safety determined to exist, by the expert system, in the configuration of the one or more of the plurality of real-world road segments.

16. The non-transitory storage medium of claim 15, wherein the instructions further comprise instructions to cause the network device to:
store the first data in a first database;
store data associated with the generated plurality of virtual road segments in the first database,
wherein the instructions to cause the network device to generate the plurality of virtual road segments based on the first data further comprise instructions to cause the network device to:
retrieve the stored first data from the first database, and
define each of the plurality of virtual road segments using the road segment location and configuration described by the first data.

17. The non-transitory storage medium of claim 15, wherein the instructions further comprise instructions to cause the network device to:
generate a report detailing the analysis of the traffic characteristics, trends, and/or events of the plurality of real-world road segments.

18. The non-transitory storage medium of claim 15, wherein the instructions to cause the network device to receive the second data describing movement of real-world objects at each of the plurality of real-world road segments further comprise instructions to cause the network device to:
receive, from the plurality of smart cameras, the second data, including associated first timestamps, describing the movement of the real-world objects at each of the plurality of real-world road segments at a first time; and
receive, from the plurality of smart cameras, the second data, including associated second timestamps, describing the movement of the real-world objects at each of the plurality of real-world road segments at a second time that is different than the first time.

19. The non-transitory storage medium of claim 18, wherein the instructions to cause the network device to execute the physics engine to simulate the movement of the objects through the plurality of virtual road segments further comprise instructions to cause the network device to:
simulate the movement of the objects through the plurality of real-world road segments further based on the first timestamps and the second timestamps.

20. The non-transitory storage medium of claim 15, wherein when generating road segment alterations, the expert system is configured to identify at least one of increasing a number of travel lanes, adding a turn lane, increasing a number of turn lanes, changing a timing interval of a traffic signal, adding a traffic sign, changing a traffic sign, removing a traffic sign, increasing the speed limit or decreasing the speed limit.

* * * * *